United States Patent
Kosaka et al.

(10) Patent No.: US 8,528,196 B2
(45) Date of Patent: Sep. 10, 2013

(54) COMPONENT MOUNTING APPARATUS AND METHOD

(75) Inventors: Kazuaki Kosaka, Yamanashi (JP);
Akira Kabeshita, Yamanashi (JP);
Nobuhiko Muraoka, Yamanashi (JP);
Syozo Kadota, Yamanashi (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/143,587

(22) PCT Filed: Jan. 8, 2010

(86) PCT No.: PCT/JP2010/000077
§ 371 (c)(1),
(2), (4) Date: Jul. 7, 2011

(87) PCT Pub. No.: WO2010/079759
PCT Pub. Date: Jul. 15, 2010

(65) Prior Publication Data
US 2011/0289772 A1    Dec. 1, 2011

(30) Foreign Application Priority Data

Jan. 8, 2009 (JP) ................. 2009-002320
Jan. 26, 2009 (JP) ................. 2009-014760
Mar. 23, 2009 (JP) ................. 2009-069627

(51) Int. Cl.
*H05K 3/30* (2006.01)
*B23P 19/00* (2006.01)

(52) U.S. Cl.
USPC ............. 29/832; 29/739; 29/740; 29/741; 29/840; 29/841

(58) Field of Classification Search
USPC ............. 29/832, 840, 841, 739, 740, 741
See application file for complete search history.

(56) References Cited

U.S. PATENT DOCUMENTS

| | | | |
|---|---|---|---|
| 5,501,005 A | 3/1996 | Onitsuka | |
| 6,594,887 B1 | 7/2003 | Okuda et al. | |

(Continued)

FOREIGN PATENT DOCUMENTS

| | | |
|---|---|---|
| JP | 4-302064 | 10/1992 |
| JP | 10-065397 | 3/1998 |

(Continued)

OTHER PUBLICATIONS

English translation of International Preliminary Report on Patentability and Written Opinion of the International Searching Authority, issued Aug. 16, 2011, in PCT/JP2010/000077.

(Continued)

*Primary Examiner* — Carl Arbes
(74) *Attorney, Agent, or Firm* — Wenderoth, Lind & Ponack, L.L.P.

(57) ABSTRACT

A component mounting apparatus for mounting components on a plurality of mounting regions placed on an edge part of a substrate along a first direction that is a direction along the edge part of the substrate, comprises component placing units for holding components placed in component delivery positions that are spaced from the edge part of the substrate in a second direction orthogonal to the first direction, moving the held components in the second direction, and placing the components onto the mounting regions, component feeding units for sequentially feeding the components to component feeding positions spaced from the component delivery positions, and component carrying units for holding the components fed to the component feeding positions, moving the held components, and placing the components in the component delivery positions. Therefore, the components can be placed even onto a large substrate with satisfactory working efficiency.

17 Claims, 31 Drawing Sheets

(56) References Cited

U.S. PATENT DOCUMENTS

| | | | |
|---|---|---|---|
| 6,971,157 B1 * | 12/2005 | Yoshida et al. | 29/739 |
| 7,003,872 B2 * | 2/2006 | Mimura et al. | 29/832 |
| 7,315,766 B2 * | 1/2008 | Chikuma et al. | 700/121 |
| 7,353,594 B2 * | 4/2008 | Yoshida et al. | 29/833 |
| 2003/0033034 A1 | 2/2003 | Tsuji et al. | |
| 2005/0125998 A1 * | 6/2005 | Mimura et al. | 29/832 |
| 2010/0014948 A1 | 1/2010 | Higashida | |

FOREIGN PATENT DOCUMENTS

| | | |
|---|---|---|
| JP | 10-303225 | 11/1998 |
| JP | 3024457 | 3/2000 |
| JP | 2000-299595 | 10/2000 |
| JP | 2001-326253 | 11/2001 |
| JP | 2002-305398 | 10/2002 |
| JP | 2003-008297 | 1/2003 |
| JP | 2004-119420 | 4/2004 |
| JP | 2006-060041 | 3/2006 |
| JP | 2006-114782 | 4/2006 |
| JP | 3781604 | 5/2006 |
| JP | 3883674 | 2/2007 |
| WO | 01/62062 | 8/2001 |
| WO | 2008/090976 | 7/2008 |

OTHER PUBLICATIONS

International Search Report issued Apr. 20, 2010 in International (PCT) Application No. PCT/JP2010/000077.

* cited by examiner

COMPONENT MOUNTING APPARATUS AND METHOD

TECHNICAL FIELD

The present invention relates to a component mounting apparatus and a component mounting method for mounting components on a plurality of mounting regions positioned on edge parts of a substrate, and to a component mounting apparatus and a component mounting method for mounting various components on a plurality of mounting regions positioned on edge parts of a glass substrate for liquid crystal display or plasma display or the like, for instance.

BACKGROUND ART

For liquid crystal display (LCD) panel, plasma display panel (PDP) or the like, a display device is produced by mounting of components such as TCP (Tape Carrier Package) components, COF (Chip On Film) components, COG (Chip On Glass) components, TAB (Tape Automated Bonding) components, flexible printed circuit boards (FPC boards), other electronic components, mechanical components, and optical components on mounting regions provided on edge parts of a glass substrate.

As shown in FIGS. 31(a) and 31(b), for instance, there has conventionally been known a method of mounting components 5 on a plurality of mounting regions 3 provided on each of two edge parts 2a, 2b on a long side (source side) and on a short side (gate side) of a substrate 1 or each of edge parts 2a, 2b, 2c on three sides thereof. Specifically, the method has been known in which the components 5 are mounted on the substrate 1 carried in, by an initial ACF applying step of applying anisotropic conductive films (which will be referred to as ACF below) 4 on the mounting regions 3 of the substrate 1 where electrodes for electrical connection to electrodes of the components 5 are formed, a subsequent component placing step of supplying the components 5 from component supplying means onto the ACFs 4 applied on the mounting regions 3 on the edge parts of the substrate 1 and placing the components 5 thereto, and a press-bonding step of applying pressures and heat to the components 5 placed to the mounting regions 3 on the long side and the short side of the substrate 1, thereby press-bonding and fixing the components 5, and electrically connecting the electrodes of the components 5 to the electrodes of the substrate 1, and in which the substrate 1 is thereafter carried out toward an apparatus for subsequent steps, as shown in FIGS. 31(a) and 31(b).

The component mounting apparatus that performs such mounting steps has an ACF applying device, a component placing device, and a long side and short side press-bonding device for performing the above steps, and a conveyor device for conveying the substrate among those working devices. The component placing device is configured so that the substrate conveyed by the conveyor device is received and held by a substrate holding unit and is horizontally moved by moving means the substrate holding unit has, so that the mounting regions on the substrate are positioned in specified component placing positions, and so that the components supplied from a component supply device are placed onto the component placing positions by placing heads (see Patent Literature 1, for instance).

As a component placing device, there has been known a device that has a component supply unit provided with a turntable which has transfer nozzles on extremities of a plurality of arms and which makes index rotation or a turntable which makes index rotation and motions in one axial direction and provided with punching devices for punching a tape-like film carrier in order to take out components, on a plurality of halting positions for the transfer nozzles, that moves the punched components to specified delivery positions with vacuum suction by the transfer nozzles, that receives the components at the delivery positions by carrying nozzles, that moves the components to specified carrying positions, and that sequentially carries the components to mounting regions on a substrate positioned by a movable table (see Patent Literature 2, for instance).

There has been known a device in which a plurality of tray component feeding mechanisms are provided in a line in a component feeding section, each of the mechanisms having a shuttle for moving a selected tray between a housed position and a part feeding position, at least one of the shuttle provided with a plurality of component holding elements, which is provided with a component carrying head for picking up a component from a tray in the component feeding position and carrying the component to any part holding element of the shuttle, which is provided with an placing head having a part placing tool and being movable and positionable along two horizontal axial directions, and which holds the component in the component holding element by the component placing tool of the placing head, moves the component in the two horizontal axial directions, and places the component onto the mounting regions on the substrate positioned in a specified position (see Patent Literature 3, for instance).

There has been known a device including substrate positioning means for holding a substrate and positioning component mounting regions thereof on specified component placement positions, tray feeding means for picking up one tray from a tray housing unit that houses stacked trays containing components, housing the tray in a feeding tray housing unit in a specified position, and stacking and housing an emptied tray in an empty tray housing unit, component pickup carrying means for sequentially picking up and horizontally moving components from trays in the supply tray housing unit, inverting the components, and carrying the components to specified component placing positions, and component placing means for receiving the components from the component pickup carrying means and placing the components onto the mounting regions on the substrate (see Patent Literature 4, for instance).

Patent Literature 1: Japanese Patent No. 3781604
Patent Literature 2: Japanese Patent No. 3024457
Patent Literature 3: Japanese Patent No. 3883674
Patent Literature 1: Japanese Patent Application Publication No. 2000-299595

SUMMARY OF INVENTION

Problems to be Solved by the Invention

In the component placing device disclosed in Patent Literature 1, however, the component placing means is configured so as to hold a required component at the component feeding position for the component in the component feeding unit, so as to move in the two horizontal axial directions toward the mounting region on the substrate positioned on a specified position, and so as to place the component onto the mounting region. Accordingly, there is a problem in that increase in size of the substrate causes requirement of time for the movement and positioning of the part placing means from the component feeding position toward the mounting region on the substrate and causes substantial decrease in efficiency of placing operations. There is another problem in that increase in an area the component feeding device occupies hinders attainment of compact configuration of the device because the component feeding unit has a configuration in which a plurality of feeding reels in postures orthogonal to a direction of conveyance of the substrate are placed in a line along the substrate conveyance direction or has a configuration in which a plurality of component feeding trays are placed in a line along the substrate conveyance direction.

In the component placing device disclosed in Patent Literature 2, the plurality of punching devices are provided around the turntable, the punched components are moved to the specified delivery positions by the carrying nozzles, the components are received by the carrying nozzles and moved to the specified carrying positions, the mounting regions on the substrate are sequentially positioned at the carrying positions by the movable table, and the components are carried onto the mounting regions on the substrate. Accordingly, there is a problem in that increase in size of the substrate results in a remarkably large configuration of the device, causes requirement of time for the movement and positioning of the large substrate, because of increase in intervals of the mounting regions, and thus causes substantial decrease in efficiency of placing operations. There is another problem in that the configuration having the plurality of punching devices provided around the turntable further increases the occupied area and thus hinders attainment of compact configuration of the device.

In the component placing device disclosed in Patent Literature 3, the plurality of tray component feeding mechanisms are provided in a line, the components fed from the tray component feeding mechanisms are held on the component holding elements of the shuttle having the plurality of component holding elements with use of the component carrying head, and the components on the component holding elements are placed onto the mounting regions on the positioned substrate by the component placing tool of the placing head movable in the two horizontal axial directions. Accordingly, there is a problem in that increase in size of the substrate causes requirement of time for the movement and positioning of the placing head and causes substantial decrease in efficiency of placing operations.

In the component placing device disclosed in Patent Literature 4, the components are sequentially picked up by the component pickup carrying means from the tray in the feeding tray housing unit of the tray feeding means, are carried to the specified component placement positions with horizontal movement and inversion thereof, are then received by the component placing means, and are placed onto the mounting regions on the substrate positioned in the specified component placing positions by the substrate positioning means. Accordingly, there is a problem in that it takes time for the component pickup carrying means to sequentially pick up the components from the tray and carry the components to the component placing positions and in that increase in size of the substrate results in a remarkably large configuration of the device, causes requirement of time for the movement and positioning of the substrate, and thus causes substantial decrease in efficiency of placing operations.

Therefore, it is an object of the invention to resolve problems described above and to provide a component mounting apparatus for mounting components on a plurality of mounting regions placed on edge parts of a substrate which component mounting apparatus is capable of placing the components on a large substrate with a satisfactory working efficiency, and a component mounting method therefor.

Means to Solving the Problem

In order to achieve the object, the invention is configured as follows.

According to a first aspect of the present invention, there is provided a component mounting apparatus for mounting components on a plurality of mounting regions placed on an edge part of a substrate along a first direction that is a direction along the edge part of the substrate, the component mounting apparatus comprising:

a component placing unit for holding a component placed in component delivery positions that are spaced from the plurality of mounting regions on the edge part of the substrate in a second direction intersecting with the first direction and that correspond to the mounting regions, for moving the held component in the second direction, and for placing the component onto the mounting region, a component feeding unit for sequentially feeding the components to a component feeding position, and a component carrying unit for holding the component fed to the component feeding position, for moving the held component, and for placing the component in each of the component delivery positions.

According to a second aspect of the present invention, there is provided the component mounting apparatus as defined in the first aspect, wherein the plurality of the component delivery positions are arranged along the first direction so as to correspond to the mounting regions respectively in the second direction, the component feeding position is a position spaced from the component delivery positions in the first direction, the component carrying unit comprises:

a component holding member for holding the component fed in the component delivery position, and a holding member moving device for moving the component holding member at least in the first direction between the component feeding position and the component delivery positions.

According to a third aspect of the present invention, there is provided the component mounting apparatus as defined in the second aspect, wherein the component placing unit comprises:

a placing head for holding the component placed in the component delivery position and for placing the held component onto the mounting regions, a second-direction moving device for moving the placing head in the second direction between the component delivery position and the mounting region, and a first-direction moving device for moving the placing head in the first direction.

According to a fourth aspect of the present invention, there is provided the component mounting apparatus as defined in Claim 3, further comprising a control device for controlling moving operations performed by the first-direction moving device, the second-direction moving device, and the holding member moving device so that the component holding member is moved in the second direction by the holding member moving device at a moving velocity higher than a moving velocity of the placing head moved by the first-direction moving device and the second-direction moving device.

According to a fifth aspect of the present invention, there is provided the component mounting apparatus as defined in the fourth aspect, wherein the control device controls operations of the component placing unit and the component carrying unit so that the component holding member is moved in the first direction from a first component delivery position and holds a new component in the component feeding position, and the component holding member holding the new component is moved in the first direction and places the new component in a second component delivery position, during a period from the placing head holds a component in the first component delivery position until the placing head is moved in the second direction and places the component in a mounting position and then the placing head is moved in the first and second directions to the second component delivery position.

According to a sixth aspect of the present invention, there is provided the component mounting apparatus as defined in the first aspect, wherein the plurality of component delivery positions are arranged along the first direction so as to correspond to the mounting regions respectively in the second direction, the component carrying unit comprises:

a plurality of component holding members for holding the components sequentially fed in the component delivery positions, and a holding member moving device for horizontally moving the plurality of component holding members from the component feeding position so as to sequentially place the component holding members in the respective component delivery positions.

According to a seventh aspect of the present invention, there is provided the component mounting apparatus as defined in the sixth aspect, wherein the component placing unit comprises:

a placing head for holding a component placed in the component delivery positions and for placing the held component onto the mounting regions, a second-direction moving device for moving the placing head in the second direction between the component delivery positions and the mounting regions, and a first-direction moving device for moving the placing head in the first direction.

According to an eighth aspect of the present invention, there is provided the component mounting apparatus as defined in the seventh aspect, wherein the component carrying unit further comprises a rotating plate which has a plurality of component holding members arranged with a uniform interval pitch on circumference thereof and which intermittently rotates the plurality of component holding members with the uniform interval pitch, wherein the holding member moving device has a movable member on which the rotating plate is mounted and a two-axis robot for moving the movable member in the first and second directions.

According to a ninth aspect of the present invention, there is provided the component mounting apparatus as defined in the eighth aspect, wherein the first and second component carrying units are placed so as to adjoin in the first direction, the movable members of the two-axis robots of the first and second component carrying units have shapes protruding toward each other with the rotating plates mounted on extremity parts of the protruding shapes, and the component mounting apparatus further comprises a control device for controlling operations of the first and second component carrying units so that the plurality of component holding members of the second component carrying unit are sequentially positioned in the component feeding position and perform operations of picking up components from the component feeding position during the plurality of component holding members of the first component carrying unit are sequentially positioned in the component delivery positions and perform operations of delivering components to the component placing head.

According to a tenth aspect of the present invention, there is provided the component mounting apparatus as defined in the sixth aspect, wherein the plurality of mounting regions provided on the edge part of the substrate are divided into a first mounting area and a second mounting area, a first component carrying unit for placing components in the component delivery positions corresponding to the mounting regions in the first mounting area and a second component carrying unit for placing components in the component delivery positions corresponding to the mounting regions in the second mounting area are provided as the component carrying unit, first and second component feeding units are provided as the component feeding unit, and the component mounting apparatus further comprises a control device for controlling operations of the component carrying units, the component feeding units, and the component placing unit so that the components fed from the first or second component feeding unit are sequentially held by the second component carrying unit in the component feeding position during the plurality of components held by the first component carrying unit are delivered to the component placing unit in the component delivery positions and are sequentially placed onto the mounting regions in the first mounting area by the component placing unit and so that the plurality of components held by the second component carrying unit are delivered to the component placing unit in the component delivery positions and are sequentially placed onto the mounting regions in the second mounting area by the component placing unit after the placement of the components onto the mounting regions in the first mounting area is completed.

According to an eleventh aspect of the present invention, there is provided the component mounting apparatus as defined in the tenth aspect, wherein a first component placing unit for sequentially placing the components delivered from the first component carrying unit onto the mounting regions in the first mounting area and a second component placing unit for sequentially placing the components delivered from the second component carrying unit onto the mounting regions in the second mounting area are provided as the component placing unit.

According to a twelfth aspect of the present invention, there is provided the component mounting apparatus as defined in the sixth aspect, wherein the component feeding unit comprises:

a feeding reel on which a tape-like component assembly in which a plurality of components are housed in series on a carrier tape is wound, a takeup reel on which the carrier tape with the components picked up from the tape-like component assembly is wound, and a component pickup unit that is placed between the feeding reel and the takeup reel and that sequentially picks up the components from the tape-like component assembly, wherein the feeding reel and the takeup reel are placed in postures along the first direction, and the component pickup unit sequentially feeds the plurality of components which are picked up from the tape-like component assembly, to the component feeding position.

According to a 13th aspect of the present invention, there is provided the component mounting apparatus as defined in the twelfth aspect, wherein the tape-like component assembly in which the carrier tape contains the plurality of components and a protection tape is stacked on a surface of the carrier tape, is wound on the feeding reel, and the component feeding units each further comprise a protection tape collecting reel on which the protection tape peeled off at a position between the feeding reel and the component pickup unit is to be wound and are arranged in line so that the protection tape collecting reel overlaps the feeding reel in the second direction.

According to a 14th aspect of the present invention, there is provided the component mounting apparatus as defined in the sixth aspect, wherein the component feeding unit comprises:

a feeding side tray housing unit for housing a plurality of trays in a stacked state, each trays containing a plurality of components, for sequentially taking out the tray from lower side of the stacked trays, and for feeding the trays to a tray feeding position, a collecting side tray housing unit for housing the trays placed at a tray collecting position after feeding of the components, in a stacked state from lower side of the stacked trays, a loading part moving device for moving a tray loading part to be loaded with a tray between the tray feeding position, a component feeding tray position for feeding of the components to the component carrying units, and a tray collecting position, a component pickup unit for sequentially picking up the components from the tray in the component feeding tray position, and a component inverting carrying unit for receiving the component from the component pickup unit, inverting the component, moving to the component feeding position, and carrying the component to a component holding member of the component carrying units.

According to a 15th aspect of the present invention, there is provided a component mounting method for mounting components on a plurality of mounting regions placed on an edge part of a substrate along a first direction that is a direction along the edge part of the substrate, the component mounting method comprising:

a component feeding step for feeding the components to a component feeding position, a component carrying step for holding the components in the component feeding position by component holding members and sequentially carrying the components to a plurality of component delivery positions spaced from the edge part of the substrate so as to correspond to the mounting regions in a second direction intersecting with the first direction, and a component placing step for holding the components, placed in the component delivery positions, by a placing head, moving the held components in the second direction, and sequentially placing the components onto the mounting regions.

According to a 16th aspect of the present invention, there is provided the component mounting method as defined in the 15th aspect, wherein the plurality of components fed to the component feeding position are sequentially held by a plurality of component holding members and are sequentially carried to the component delivery positions in the component carrying step.

According to a 17th aspect of the present invention, there is provided the component mounting method as defined in the 15th aspect, wherein, in the component carrying step, the plurality of components fed to the component feeding position are sequentially held by a plurality of component holding members arranged with a uniform interval pitch on circumference of a rotating plate that is movable and intermittently rotatable so as to be positioned in the first and second directions, and the held components are sequentially carried to the placing head with the component holding members sequentially positioned in the component delivery positions by movement in the first and second directions and intermittent rotation of the rotating plate.

According to an 18th aspect of the present invention, there is provided the component mounting method as defined in the 15th aspect, wherein the plurality of mounting regions arranged on the edge part of the substrate are divided into a first mounting area and a second mounting area, in the component carrying step, a carrying operation for carrying the components to the component delivery positions corresponding to the respective mounting regions in the first mounting area is performed by a first component carrying unit having a plurality of component holding members, and a carrying operation for carrying the components to the component delivery positions corresponding to the respective mounting regions in the second mounting area is performed by a second component carrying unit having a plurality of component holding members, the plurality of components fed in the component feeding position are sequentially held by the second component carrying unit, during the component carrying step is performed by the first component carrying unit while the components delivered from the first component carrying unit to the placing head in the component delivery positions are sequentially placed onto the mounting regions in the first mounting area, and the component carrying step by the second component carrying unit is performed upon completion of placement of the components onto the mounting regions in the first mounting area so that the components delivered to the placing head in the component delivery positions by the second component carrying unit are sequentially placed onto the mounting regions in the second mounting area.

According to a 19th aspect of the present invention, there is provided the component mounting method as defined in the 18th aspect, wherein an placing operation for sequentially placing the components, delivered from the first component carrying unit, onto the mounting regions in the first mounting area is performed by a first placing head, and a placing operation for sequentially placing the components, delivered from the second component carrying unit, onto the mounting regions in the second mounting area is performed by a second placing head.

According to other aspects of the invention, a component mounting apparatus is provided in which the component feeding units each comprise the feeding reel on which the tape-like component assembly in which the plurality of components are housed in series on the carrier tape is wound, the takeup reel on which the carrier tape with the components picked up from the tape-like component assembly therein is wound, and the component pickup unit that is placed between the feeding reel and the takeup reel and that sequentially picks up the components from the tape-like component assembly, the feeding reel and the takeup reel placed in postures along the first direction, the component pickup unit sequentially feeding the plurality of components, picked up from the tape-like component assembly, to the component feeding position, and in which the tape-like component assembly in which the carrier tape contains the plurality of components and has a surface stacked with a protection tape is wound on the feeding reel, in which the component feeding units each further comprise a protection tape collecting reel on which the protection tape peeled off between the feeding reel and the component pickup unit is to be wound and are arranged in a line so that the protection tape collecting reels overlap the feeding reels in the second direction, and in which support members are provided for supporting either of the feeding reels and the protection tape collecting reels so as to be capable opening and closing the reels between an overlap position and an overlap released position.

Effect of the Invention

According to the component mounting apparatus and component mounting method of the invention, the component placing unit can sequentially be moved to and positioned on the mounting regions in the state in which the substrate is positioned in the specified position when the component placement is performed, and thus the positioning with a high accuracy can be performed in a short period of time. In the component placing unit, the components held in component receiving positions are moved in the second direction and mounted on the mounting regions, and thus tact time for the placing operations in the component placement can be shortened. Furthermore, the components can be delivered by the component carrying unit from the component feeding position to the component receiving position while the placing operation is performed by the component placing unit, and thus the working efficiency in the component placement can further be increased. The substrate is not moved during the operations of placing the components, and thus compact configuration of the apparatus for a large substrate, in particular can be attained.

BRIEF DESCRIPTION OF DRAWINGS

These aspects and features of the present invention will become clear from the following description taken in conjunction with the preferred embodiments thereof with reference to the accompanying drawings, in which:

FIG. 31(*b*) is a perspective view showing a component mounting step for a substrate having a plurality of mounting regions on each of three edge parts thereof;

DESCRIPTION OF PREFERRED EMBODIMENTS

Figure 1:
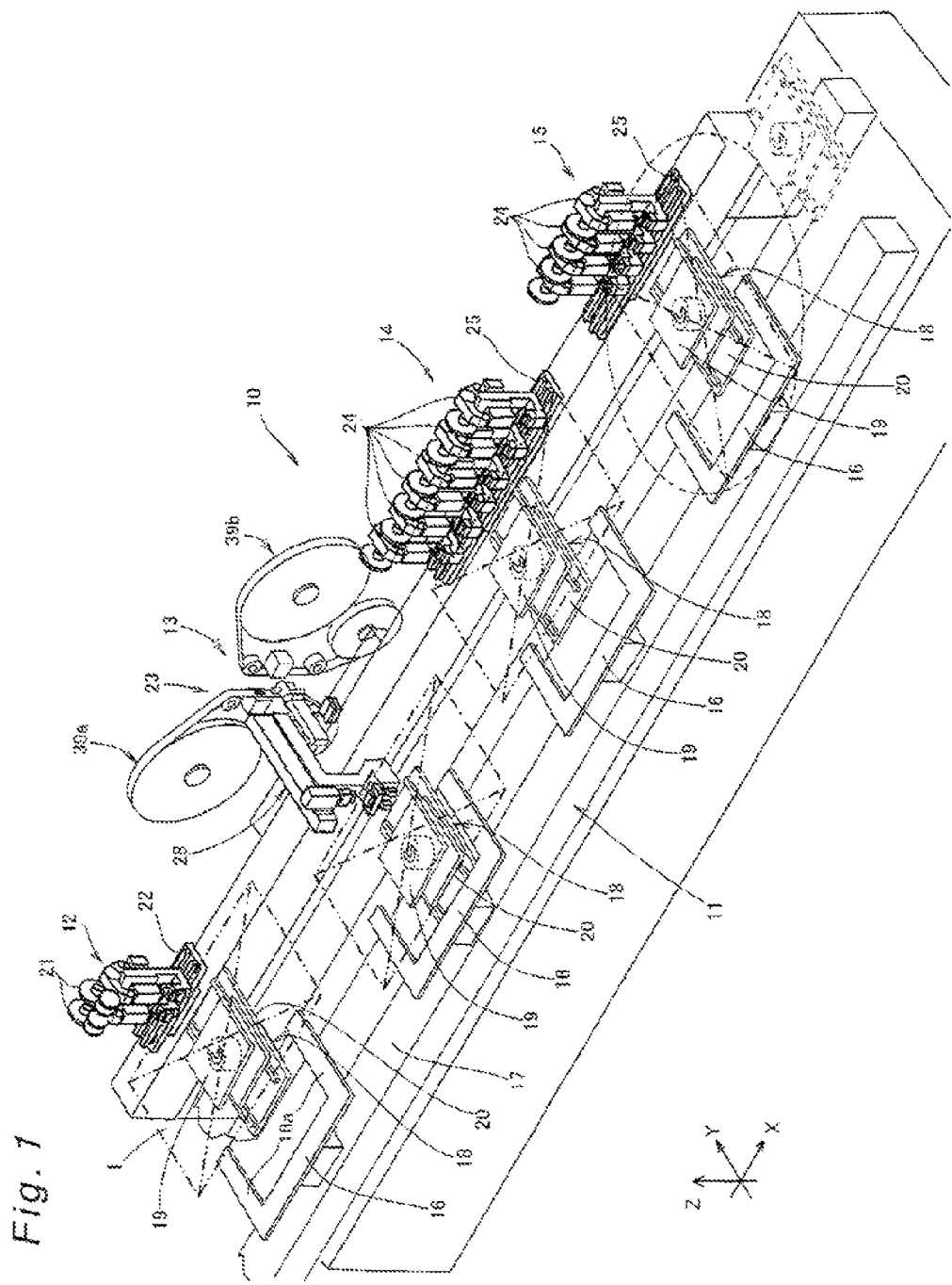
FIG. 1 is a perspective view showing a general schematic configuration of a component mounting apparatus in accordance with a first embodiment of the invention.

Before the description of the present invention proceeds, it is to be noted that like parts are designated by like reference numerals throughout the accompanying drawings.

Hereinbelow, embodiments in which the invention is applied to component mounting apparatuses for mounting components such as TCP, COF, and IC on a substrate such as a glass substrate of LCD, PDP or the like will be described with reference to FIGS. 1 through 31(a), 31(b). The component mounting apparatus and component mounting methods of the invention can be applied to component placing devices and component placing methods for placing (i.e., temporarily fixing) components onto a substrate, other than component mounting apparatuses and component mounting methods for mounting components onto a substrate. Accordingly, "component mounting" in the invention encompasses fixation of components onto a substrate by press-bonding or the like and temporary fixation of components onto a substrate and has a broad meaning including placement of components.

First Embodiment

Initially, a first embodiment in accordance with the component mounting apparatus of the invention will be described with reference to FIGS. 1 through 5 and FIG. 31(a).

Figure 31:
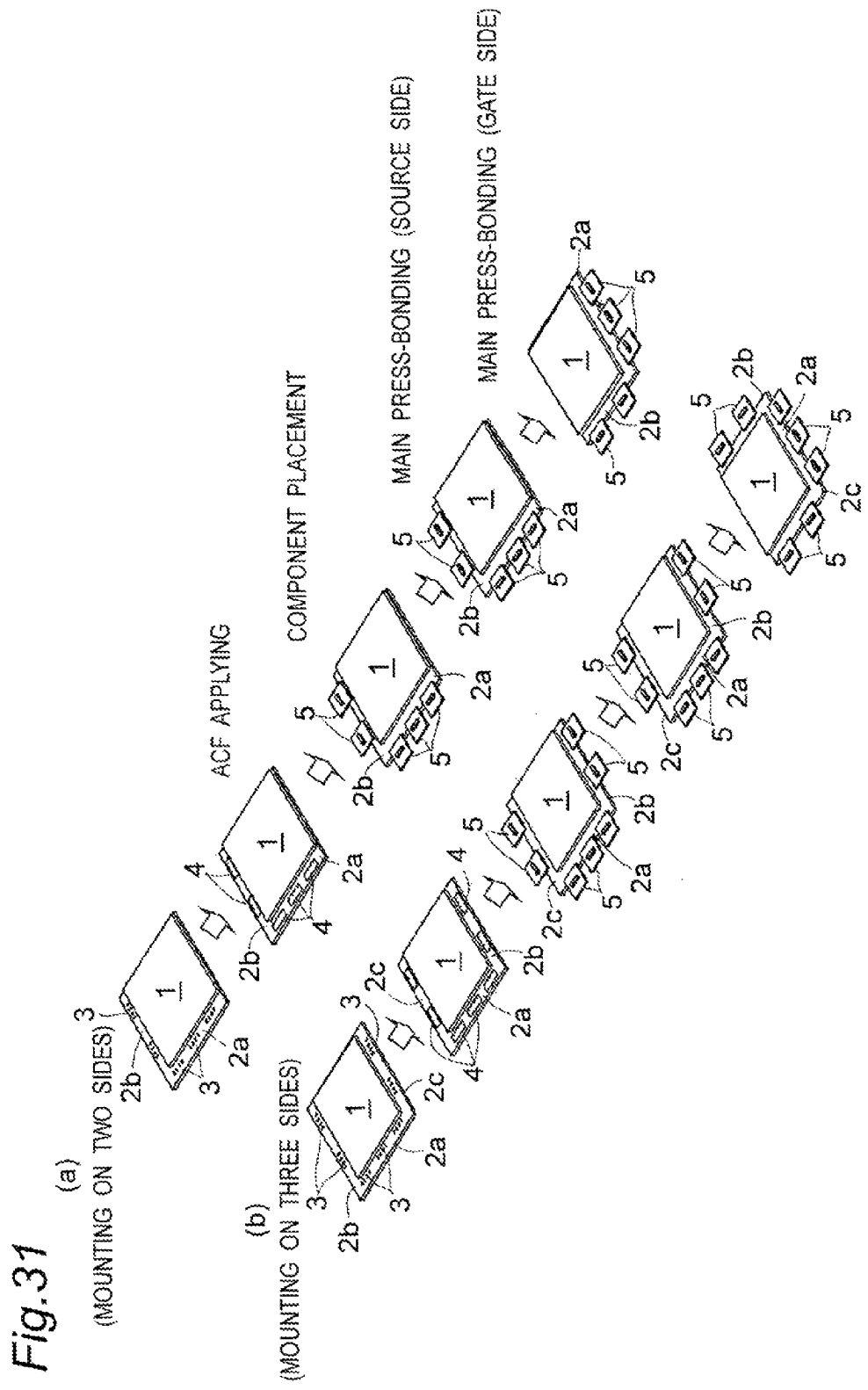
FIG. 31(*a*) is a perspective view showing a component mounting step for a substrate having a plurality of mounting regions on each of two edge parts thereof.

As shown in FIG. 31, a substrate 1 that is an object for mounting in the embodiment is a glass substrate that is formed of two glass plates being in shape of rectangles with sides having lengths on the order of several hundred millimeters to two thousand millimeters, having thicknesses on the order of 0.5 to 0.7 mm, and applied together. On one edge part or a plurality of (two in an example shown in FIG. 31(a), three in an example shown in FIG. 31(b)) edge parts 2a, 2b of the substrate 1, a plurality of connection electrode parts in which connection electrodes comprising a large number of transparent electrodes are arranged with minute pitches are placed at intervals on an inside surface of protruding one of the glass plates, and the connection electrode parts form mounting regions 3 of the substrate 1 on which components 5 are to be mounted. Once the substrate 1 is carried into a component mounting apparatus 10, the substrate 1 is supported in a horizontal posture by a conveyor device 11 and is conveyed in one direction (X-direction: first direction) along a surface of the substrate 1.

In the component mounting apparatus 10, the components 5 are mounted on the mounting regions 3 of the substrate 1 through an ACF applying step of applying ACFs 4 on the mounting regions 3 provided on the edge parts 2a, 2b of the substrate 1, a component placing step of placing the components 5 such as TCP onto the mounting regions 3 through the ACFs 4 applied on the mounting regions 3, by applying heat and pressures onto the components 5, and a press-bonding step of heating and pressing the placed components 5 by a temperature and a pressure that are higher than those in the component placing step, attaining mutual connections between the connection electrodes of the substrate 1 and connection electrodes of the components 5, and fixing the components 5 onto the substrate 1 by curing the ACFs 4 in that state, while the substrate 1 is conveyed in the X-direction by the conveyor device 11, and the substrate 1 on which the components 5 have been mounted is carried out. Though the press-bonding (main press-bonding (source side)) of the components 5 placed onto the long-side edge part 2a and the press-bonding (main press-bonding (gate side)) of the components 5 placed onto the short-side edge part 2b are performed in separate steps in FIG. 31(a), the press-bonding of the components 5 placed onto both the edge parts 2a, 2b may be performed in a single step.

In order to perform the above mounting steps, an ACF applying device 12 for performing an ACF applying operation, a component placing device 13 for performing an component placing operation, and press-bonding devices 14, 15 for performing operations of press-bonding the components on the long-side edge part 2a and the short-side edge part 2b of the substrate 1 are placed in the component mounting apparatus 10 in order of mention along the X-direction along a substrate conveyance direction in which the conveyor device 11 conveys the substrate 1. When elements common among the ACF applying device 12, the component placing device 13, and the press-bonding devices 14, 15 will be explained in description below, the devices may generically be referred to as "working devices 12 through 15."

The conveyor device 11 includes substrate placement elements 16 each having a pair of support arms 16a, 16a for placement and both end support of the substrate 1, corresponding to the working devices 12 through 15. The substrate placement elements 16 are reciprocated by a drive mechanism 17 in synchronization with one another in the X-direction that is the substrate conveyance direction, so that the substrate 1 can sequentially be carried in and out for the working devices 12 through 15 by the conveyor device 11.

The working devices 12 through 15 are each provided with a moving device 18 for positioning the edge part 2a or 2b of the substrate 1, received from the conveyor device 11, in a specified working position set opposite to the conveyor device 11 with respect to a Y-direction. The moving device 18 has a substrate holding unit 19 for supporting center part of the substrate 1 and a moving table 20 for moving and positioning the substrate holding unit 19 in the X-direction, the Y-direction (second direction) orthogonal thereto, a vertical Z-direction, and a θ-direction around a Z-axis. The moving devices 18 are each capable of holding the substrate 1 on the substrate holding unit 19 and capable of sequentially positioning the two edge parts 2a, 2b of the substrate 1 in the specified working positions for the working devices 12 through 15.

The ACF applying device 12 has a plurality of ACF applying units 21 for applying the ACFs 4 on the mounting regions 3 on the edge part 2a or 2b of the substrate 1 which units are placed opposite to the conveyor device 11 with respect to the moving device 18 in the Y-direction. The plurality of ACF applying units 21 can individually and independently be moved and positioned along the edge part 2a or 2b of the substrate 1 by a linear guide 22, and the plurality of ACF applying units 21 placed on the linear guide 22 can integrally be moved and positioned by a linear motor (not shown).

The component placing device 13 has component placing means 23 for sequentially placing the components 5 onto the ACFs 4 applied on the mounting regions 3 on the edge part 2a or 2b of the substrate 1 and the component placing means 23 is placed opposite to the conveyor device 11 with respect to the moving device 18 in the Y-direction. The component placing means 23 is a principal part of the invention, and a detailed structure thereof will be described later.

The press-bonding devices 14, 15 each have a plurality of press-bonding units 24 for press-bonding the components 5 placed through the ACFs 4 onto the mounting regions 3 on the edge part 2a or 2b of the substrate 1 by applying heat and pressures thereto and the press-bonding units 24 are placed opposite to the conveyor device 11 with respect to the moving device 18 in the Y-direction. The press-bonding units 24 can individually and independently be moved and positioned along the edge part 2a of the substrate 1 by a linear guide 25, and the plurality of press-bonding units 24 placed on the linear guide 25 can integrally be moved and positioned by a linear motor (not shown).

Subsequently, a detailed configuration of the component placing device 13 will be described with reference to FIGS. 2 and 3. In the component placing device 13, the component placing means 23 has a component placing unit 26 (see FIGS. 4D and 4E) for sequentially moving to positions corresponding to the mounting regions 3 on the edge part 2a or 2b of the substrate 1 positioned in the specified working position, receiving a component in a component delivery position R that is one fixed point, and placing the component 5 onto a mounting region 3 on the substrate 1 in a component placing position M that is the other fixed point, a component feeding unit 27 (see FIGS. 4A through 4C) for feeding a component 5 to a specified component feeding position S, and a component carrying unit 28 (see FIGS. 4C through 4E) for carrying the component 5, fed to the component feeding position S by the component feeding unit 27, to the component delivery position R in the component placing unit 26.

The component placing unit 26 is configured so that the unit can be moved and positioned by a first moving mechanism 29 (first direction moving device) in the X-direction along the conveyance direction for the substrate 1, and is sequentially positioned in positions corresponding to the plurality of mounting regions 3 in the direction along the substrate conveyance direction which, regions are provided on the edge part 2a or 2b of the substrate 1 positioned in the specified working position. The component placing unit 26 is provided with a receiving member 30 that is vertically movable between a support position in which the mounting regions 3 on the edge part 2a, 2b are supported from a lower surface side of the substrate and a withdrawal position on lower side and that is formed of a transparent member such as quartz and a pair of recognition cameras 31 for recognizing through the transparent receiving member 30 position marks (not shown) provided in specified positions on the mounting regions 3 and in both side parts of the component 5, below the substrate 1, and is provided with the placing means 32 for placing the component 5 on the mounting region 3 on the edge part 2a, 2b, above the substrate 1.

The placing means 32 of the component placing unit 26 has a moving member 34 that can be moved and positioned in the Y-direction and the Z-direction by a two-axis robot 33 (second-direction moving device) and an placing head 35 that is mounted on the moving member 34 and that sucks, holds and places the component 5. The moving member 34 is configured so as to reciprocate in the Y-direction between the component carrying unit 28 and the mounting regions 3 on the substrate 1 positioned in the specified working position, so as to receive and hold the component 5 from the component carrying unit 28 in the component delivery position R, and so as to vertically move in the Z-direction when the component 5 is placed onto the mounting region 3 in the component placing position M. The placing head 35 has suction holding means and heating means and is placed onto the moving member 34 so as to be capable of performing press and spacing motions with respect to the mounting region 3 on the edge part 2a, 2b of the substrate 1 and rotating about the vertical axis. Thus the placing head 35 is capable of holding the component 5 by suction thereof, accurately correcting a position thereof, and placing the component 5 onto the mounting region 3 on the substrate 1 by heating and pressing. In the embodiment, the position of the mounting region 3 on the substrate 1 is the same as the component placing position M.

Figure 2:
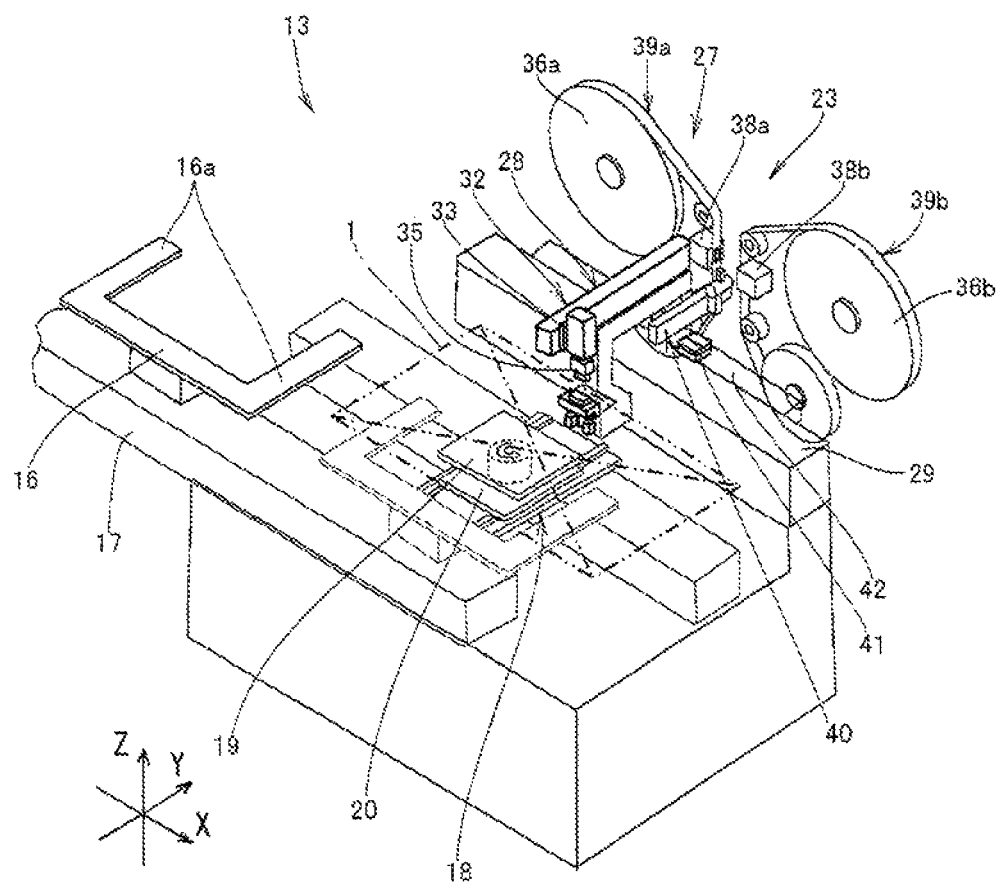
FIG. 2 is a perspective view showing a general configuration of a component placing device in accordance with the first embodiment.
Figure 3:
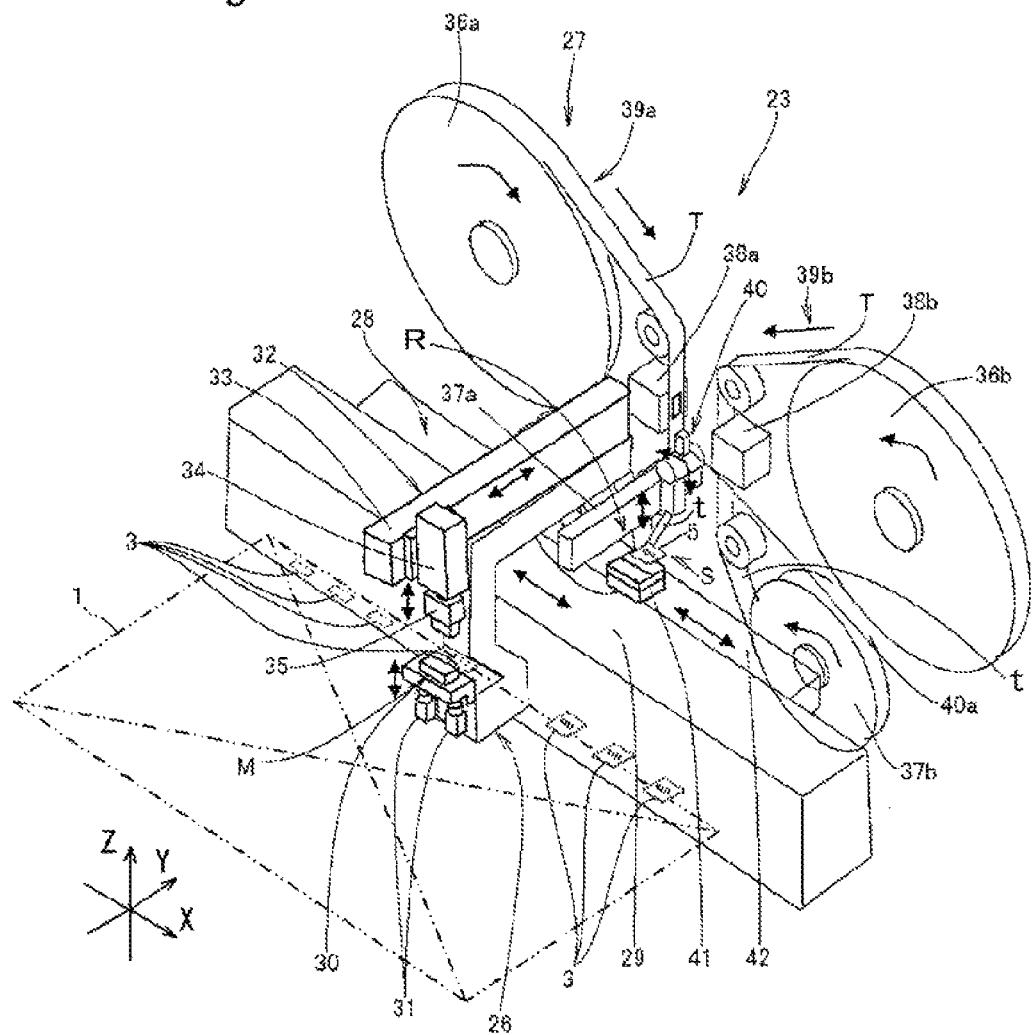
FIG. 3 is a perspective view showing a configuration of a principal part of the component placing device in accordance with the first embodiment.

As shown in FIGS. 2 and 3, the component feeding unit 27 has two component feeding means 39a, 39b comprising a pair of feeding reels 36a, 36b that are provided along the conveyance direction (X-direction) for the substrate 1 so that circumferential surfaces thereof face each other, takeup reels 37a, 37b that are provided at a distance therebetween under the feeding reels 36a, 36b so as to overlap therewith in plan view, and component pickup units 38a, 38b that are provided between the feeding reel 36a and the takeup reel 37a and between the feeding reel 36b and the takeup reel 37b, respectively, and has carrying means 40 for carrying the components 5, picked up by the component pickup units 38a, 38b, to the specified component feeding position S.

A tape-like component assembly T in which a large number of components 5 (5a) to be mounted on the edge part 2a on the long side (source side) of the substrate 1 are housed and held on a long carrier tape t is wound on the feeding reel 36a, and a tape-like component assembly T in which a large number of components 5 (5b) to be mounted on the edge part 2b on the short side (gate side) of the substrate 1 are held on a long carrier tape t is wound on the feeding reel 36b. The tape-like component assemblies T drawn from the feeding reels 36a, 36b are punched out by the component pickup units 38a, 38b, and the components 5 (5a, 5b) can thereby be picked up. In such a configuration of the embodiment, the components 5a on the source side and the components 5b on the gate side, i.e., two different types of components can selectively be fed by the component feeding means 39a, 39b.

Figure 4A:
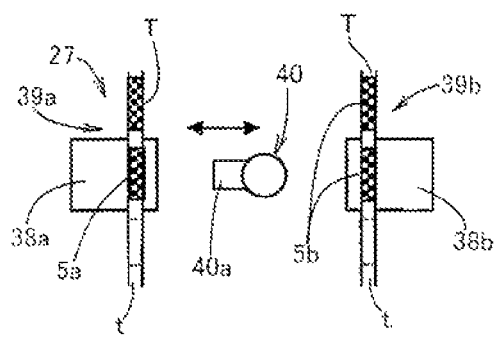
FIG. 4A is an illustration of an operation step of the component placing device of the first embodiment.
Figure 4B:
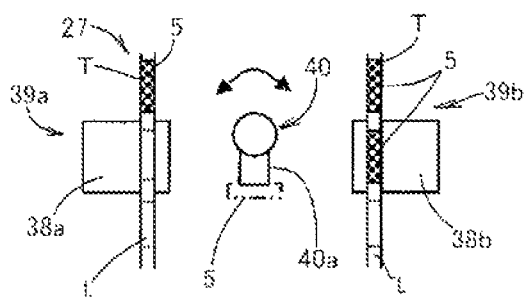
FIG. 4B is an illustration of an operation step of the component placing device of the first embodiment.
Figure 4C:
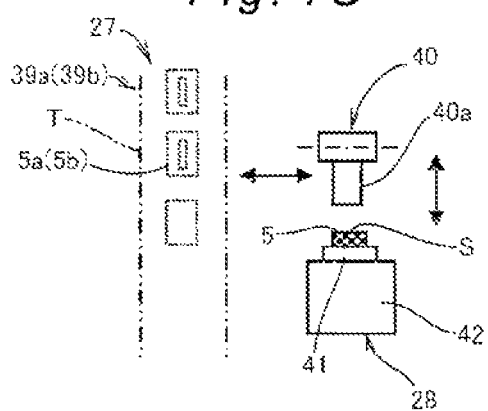
FIG. 4C is an illustration of an operation step of the component placing device of the first embodiment.

The carrying means 40 of the component feeding unit 27 comprises a two-axis robot device. Specifically, the carrying means 40 is configured so that the carrying head 40a sucks and holds the component 5 (5a or 5b) punched out, with horizontal protruding and retracting motions with respect to the component pickup units 38a, 38b, as shown in FIG. 4A, thereafter pivots downward as shown in FIG. 4B, subsequently moves in the Y-direction to a position directly above the component carrying unit 28, and thereafter feeds the component 5 (5a or 5b) to the specified component feeding position S with a lowering motion, as shown in FIG. 4C.

The component carrying unit 28 is configured so that a component holding member 41 that sucks and holds the component 5 fed to the component feeding position S by the component feeding unit 27 can be moved and positioned independently of the component placing unit 26 by a second moving mechanism 42 (holding member moving device) in the X-direction along the substrate conveyance direction. The second moving mechanism 42 moves the light and compact component holding member 41 and is thus capable of moving at a speed higher than that of the first moving mechanism 29 that moves and positions the component placing unit 26 in the X-direction along the substrate conveyance direction.

Subsequently, a component placing operation performed by the component placing device 13 having an above configuration will be described with reference to an operation flow chart of FIG. 5 and with reference to FIGS. 2, 3 and 4A through 4E.

An operation of forwarding the tape-like component assembly T that holds the component 5a or 5b to be fed subsequently is performed in either of the pair of left and right component feeding means 39a, 39b of the component feeding unit 27 (step S1), and the component 5a or 5b is subsequently punched out and picked up by actuation of the component pickup unit 38a or 38b. The component 5a or 5b picked up by punching is carried to the component feeding position S by the carrying means 40, as shown in FIGS. 4A through 4C (step S2).

Subsequently, the component 5a or 5b fed to the component feeding position S is sucked and held by the component holding member 41 of the component carrying unit 28 that has been positioned in advance in the component feeding position S, and the component holding member 41 is moved in the X-direction along the substrate conveyance direction by the second moving mechanism 42. After that, the component 5a or 5b is moved to one component delivery position R out of a plurality of component delivery positions R that are positions in which the component 5a or 5b is delivered to the placing head 35 of the component placing unit 26, i.e., that are positions spaced apart from the edge part of the substrate 1 in the Y-direction and corresponding to the plurality of mounting regions 3 on the substrate 1 (step S3).

The component placing unit 26 is moved and positioned in advance by the first moving mechanism 29 to the component delivery position R corresponding to one mounting region 3 out of the plurality of mounting regions 3 in which the component 5a or 5b is placed onto the edge part 2a or 2b of the substrate 1 positioned by the moving device 18 in the specified working position in the X-direction along the substrate conveyance direction. After that, the component 5a or 5b positioned in the component delivery position R is delivered from the component holding member 41 of the component carrying unit 28 to the placing head 35 of the component placing unit 26 and is held by being sucked thereby (step S4).

Figure 4D:
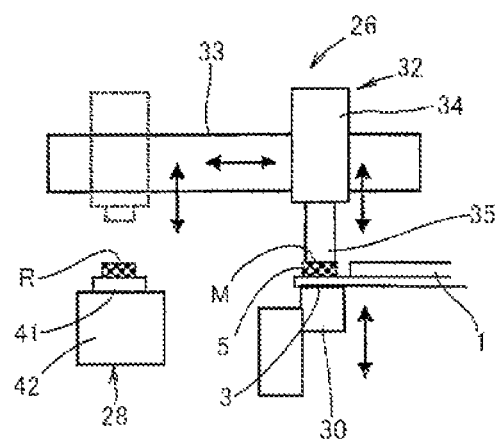
FIG. 4D is an illustration of an operation step of the component placing device of the first embodiment.
Figure 4E:
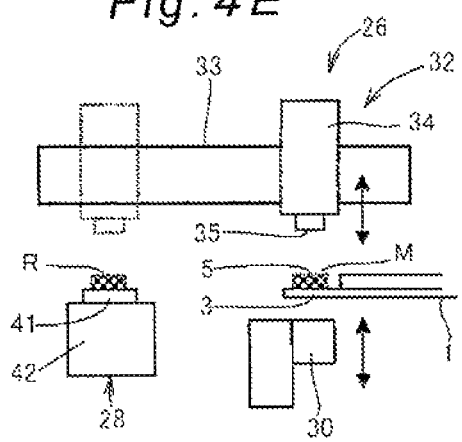
FIG. 4E is an illustration of an operation step of the component placing device of the first embodiment.
Figure 5:
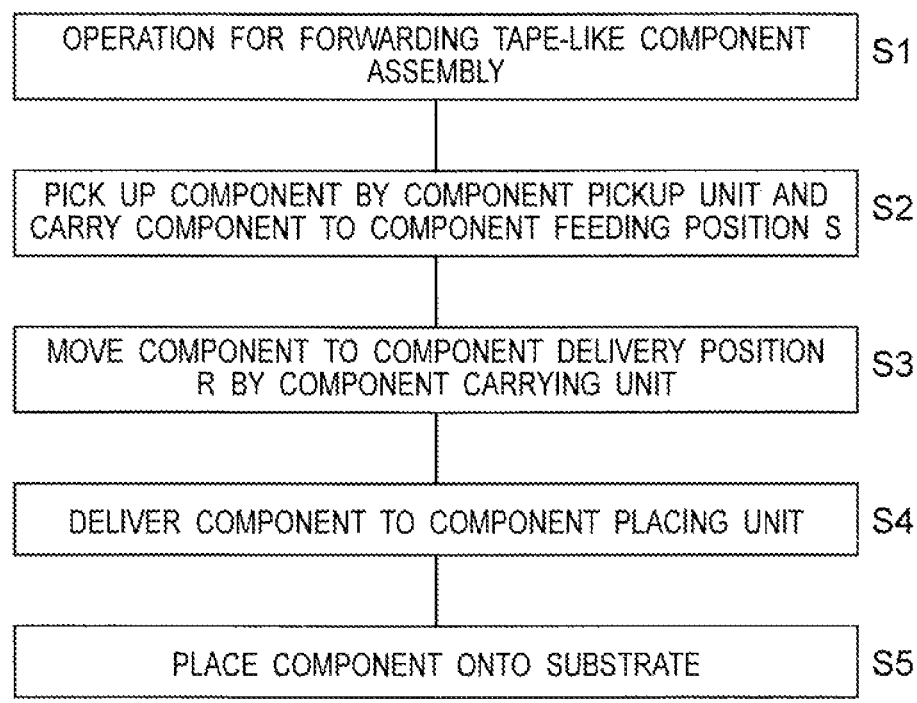
FIG. 5 is an operation flow chart for the component placing device in accordance with the first embodiment.

In the component placing unit 26, subsequently, the placing head 35 sucking and holding the component 5a or 5b is moved to the component placing position M by the two-axis robot 33 as shown in FIG. 4D. After that, the placing head 35 is pressed against the mounting region 3 on the substrate 1 that is being supported by the receiving member 30 from the lower surface side of the substrate, so that the component 5a or 5b is placed onto the mounting region 3 (step S5). As shown in FIG. 4E, subsequently, the placing head 35 makes an upward spacing motion, the receiving member 30 makes a downward spacing motion, and the component placing unit 26 moves to a position corresponding to the next mounting region 3.

On the other hand, the component holding member 41 of the component carrying unit 28 that has delivered the component 5a or 5b to the placing head 35 in the component delivery position R in the step S4 is thereafter moved in the X-direction along the substrate conveyance direction by the second moving mechanism 42 and is positioned in the component feeding position S. The next component 5a or 5b, which has been fed to the component feeding position S, is sucked and held by the component holding member 41, and the sucked and held next component 5a or 5b is thereafter moved to and positioned in the component delivery position R corresponding to the next mounting region 3. That is, the steps S1 through S3 are performed by the component feeding unit 27 and the component placing unit 26 while the steps S4, S5 are performed in the component placing unit 26, and thus the operation of placing the component 5a or 5b onto the mounting position 3 is repeated.

According to the component placing device 13 of the first embodiment, in the component placing means 23, the component 5a, 5b fed to the component feeding position S by the component feeding unit 27 is held by the component holding member 41 of the component carrying unit 28, moved along the X-direction, and positioned in the component delivery position R. The component delivery position R is set as a position corresponding to one mounting region 3 for a subsequent placing operation, with respect to the Y-direction, out of the plurality of mounting regions 3 provided on the substrate 1 positioned in the specified position along the substrate conveyance direction by the moving device 18. The placing head 35 receives the component 5a, 5b in the component delivery position R and moves in the Y-direction orthogonal to the substrate conveyance direction, and the component 5a, 5b is placed onto the mounting region 3 in the component placing position M. Therefore, the component placing unit 26 can sequentially be moved to and positioned on the mounting regions 3 in a state in which the substrate 1 is fixed, and thus the positioning with a high accuracy can be performed easily and in a short period of time. In the component placing unit 26, the placing head 35 moves for the placement between the two fixed points of the component delivery position R and the component placing position M, and thus tact time for the placing operations can be shortened. Furthermore, the next component 5a or 5b can be delivered by the component carrying unit 28 from the component feeding position S of the component feeding unit 27 for the component placing unit 26 in the placing operation by the placing head 35, and thus working efficiency in the component placement can be increased.

The component holding member 41 of the component carrying unit 28 is reciprocated in the X-direction by the second moving mechanism 42 between the component feeding position S and the component delivery positions R corresponding to the plurality of mounting regions 3 on the substrate 1 that are provided along the X-direction of the substrate conveyance direction. Accordingly, the component carrying operations of delivering the components 5a or 5b from the component feeding position S to the component delivery positions R for the component placing unit 26 can be attained by simple operations in which the component holding member 41 is reciprocated in the X-direction along the conveyance direction for the substrate 1, without complication of the configuration of the device.

A moving velocity of the component holding member 41 given by the second moving mechanism 42 (i.e., moving velocity between the component feeding position S and the component delivery positions R) in the component carrying unit 28 is set to be higher than a moving velocity of the component placing unit 26 in the substrate conveyance direction that is given by the first moving mechanism 29. While the component placing unit 26 that can move at only the lower velocity because of necessity of the positioning with a high accuracy moves to the position corresponding to the next mounting region 3 on the substrate 1, the simple and light component holding member 41 is capable of catching up with the component placing unit 26 by moving at the higher velocity in the substrate conveyance direction. Accordingly, the component 5a, 5b can be delivered while the component placing unit 26 is moving or halted just after the movement, so that the tact time for the placing operations can further be shortened.

The component placing unit 26 moves in the Y-direction orthogonal to the substrate conveyance direction between the component delivery position R where the placing head 35 receives the component 5a or 5b from the component holding member 41 of the component carrying unit 28 and the mounting region 3 on the substrate 1, and places the component 5a or 5b onto the mounting region 3. Accordingly, the component 5a or 5b received in the component delivery position R can be placed onto the mounting region 3 by a simple operation in which the placing head 35 moves in the Y-direction, and high-speed component mounting can be attained without complication of the configuration of the device.

In the component feeding unit 27, the pair of component feeding means 39a, 39b comprising the feeding reels 36a, 36b, the takeup reels 37a, 37b, the component pickup units 38a, 38b are placed so as to face each other in the X-direction along the substrate conveyance direction, and the takeup reels 37a, 37b are placed under the feeding reels 36a, 36b so as to overlap therewith in plan view. The components 5 are carried to the specified component feeding position S by the carrying means 40 provided between the component pickup units 38a and 38b. Thus the component feeding unit 27 can be configured compactly in the Y-direction. Accordingly, a device length of the component placing device 13 in the substrate conveyance direction can be reduced.

According to the first embodiment, as described above, the substrate 1 does not have to be moved to the component placing position M in which the component 5a or 5b is to be mounted on the mounting region 3 on the substrate 1; in each of the placing operations for the mounting regions 3, and thus compact configuration of the device for a large substrate, in particular, the placing operations in short tact time as described above, and high efficiency of component mounting can be attained.

Though an example in which the placing means 32 and the like of the component placing unit 26 are moved in the Y-direction (second-direction) orthogonal to the X-direction (first direction) that is the direction along the edge part 2a or 2b of the substrate 1 (i.e., the conveyance direction for the substrate 1) in above description, the second direction is not limited to that orthogonal to the first direction but has only to be set as a direction intersecting with the first direction. That is, the second direction may generally be orthogonal to the first direction.

Second Embodiment

Hereinbelow, a second embodiment in accordance with the component mounting apparatus of the invention will be described with reference to FIGS. 6 through 9. In description on the embodiment below, the same components as those of the precedent embodiment will be provided with the same reference characters, description thereof will be omitted, and only differences will be described in general.

The example of configuration in which the components 5 are mounted on the mounting regions 3 on the substrate 1 while the substrate 1 is conveyed in a horizontal posture has been disclosed as the component mounting apparatus 10 of the first embodiment, whereas components 5 are mounted on mounting regions 3 on a substrate 1 while the substrate 1 is conveyed in a practically vertical posture with respect to a horizontal plane, in a component mounting apparatus 10 of the second embodiment.

Figure 9:
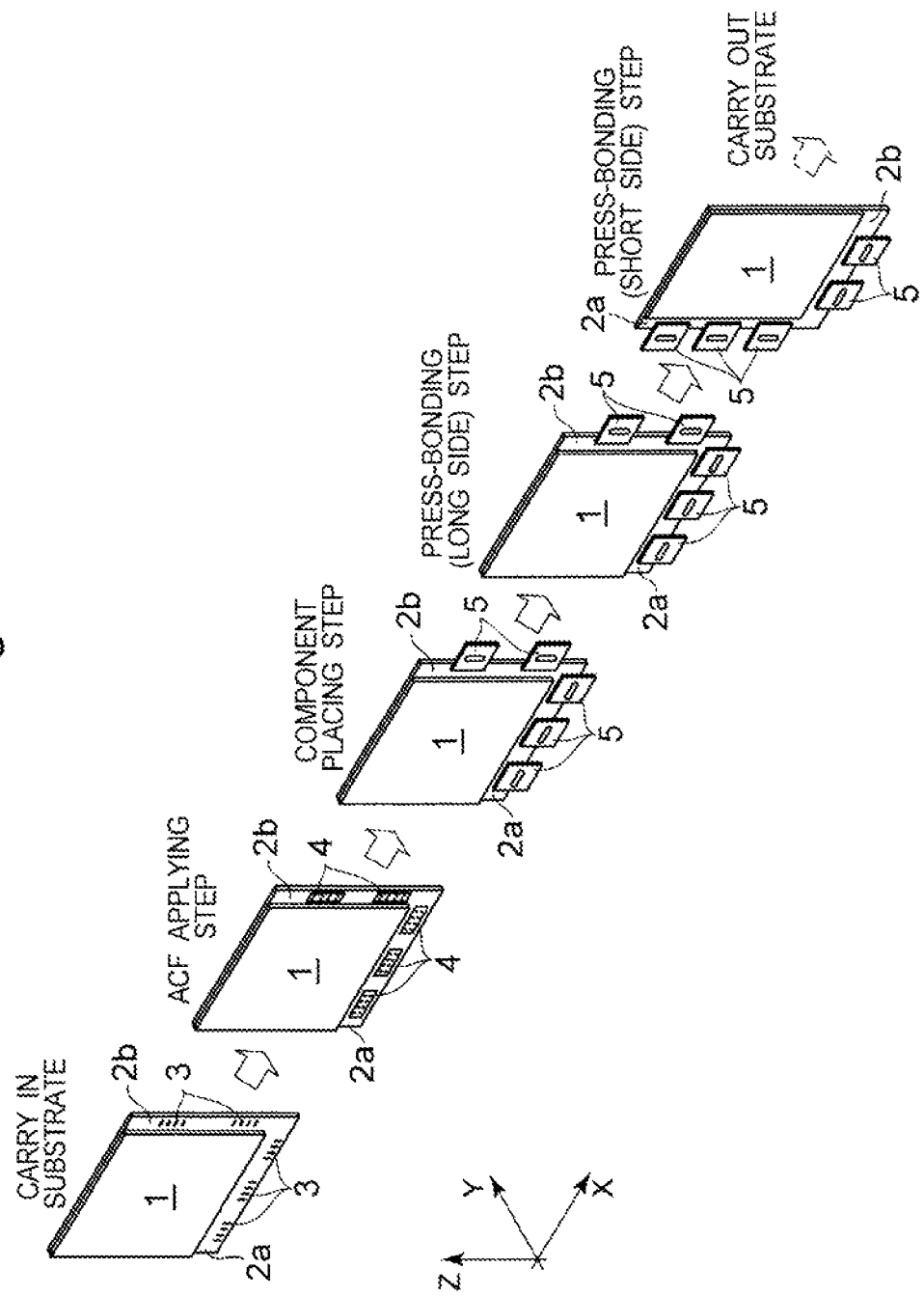
FIG. 9 is a perspective view showing a component mounting step for a substrate in a vertical posture.

In the component mounting apparatus 10 of the second embodiment, as shown in FIG. 9, an ACF applying step of applying ACFs 4 on the mounting regions 3 of the substrate 1 while the substrate 1 is held by suction and is conveyed in an X-direction in the practically vertical posture with respect to the horizontal plane, a component placing step of placing the components 5 onto the ACFs 4 applied on the mounting regions 3 on the substrate 1 and placing the components 5 thereto, and a press-bonding step of press-bonding the components 5 placed to the mounting regions 3 on a long side and a short side of the substrate 1, by applying pressures and heat thereto are sequentially performed, the substrate 1 is thereafter carried out toward an apparatus for subsequent steps, and the steps are performed in a state the practically vertical posture of the substrate 1 is held.

Figure 6:
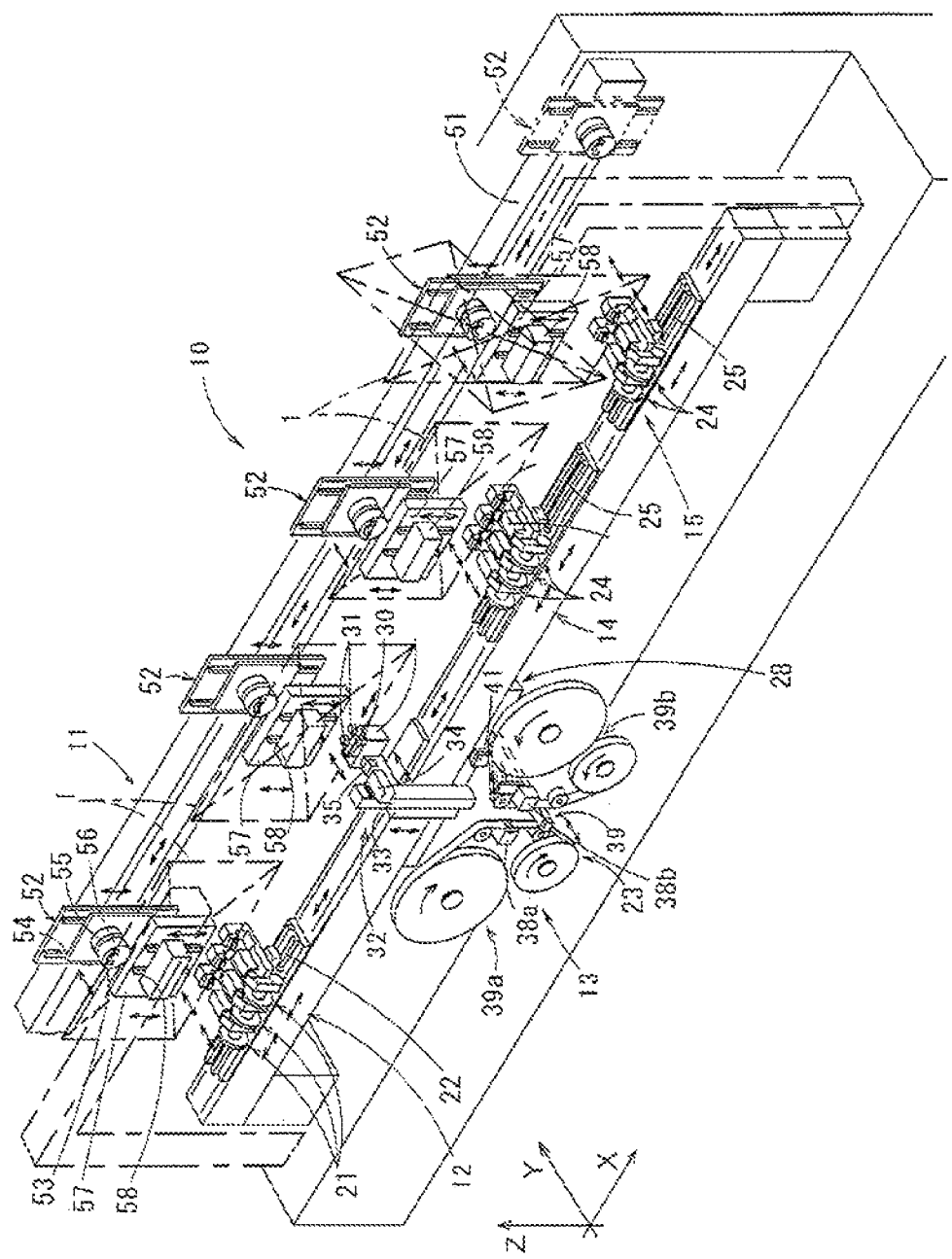
FIG. 6 is a perspective view showing a general schematic configuration of a component mounting apparatus in accordance with a second embodiment of the invention.

As shown in FIG. 6, a conveyor device 11 includes a plurality of substrate conveying means 52 that are capable of independently reciprocating along a conveyor path configuring member 51 and that correspond to working devices 12 through 15. The substrate conveying means 52 are configured so as to reciprocate between a carry-in position for the substrate 1, positions facing the working devices 12 through 15, and a carry-out position for the substrate 1.

The substrate conveying means 52 are each provided with a conveyed substrate holding part 53 for sucking and holding the substrate 1 in the practically vertical posture, an up-and-down device 54 for moving and positioning the conveyed substrate holding part 53 in a vertical direction that is an up-and-down direction, an advance-and-retract device for making advancing and retracting motions of the conveyed substrate holding part 53 to and from the working devices 12 through 15 so as to deliver the substrate 1, sucked and held by the conveyed substrate holding part 53, to the working devices, and a turning device 56 for turning the conveyed substrate holding part 53 back and forth at least 90 degrees in general about a horizontal axis.

The working devices 12 through 15 are each provided with a substrate holding part 57 for sucking and holding a surface except at least the mounting regions on edge parts 2a, 2b of the substrate 1, delivered from the substrate conveying means 52, in the practically vertical posture with respect to the horizontal plane and an up-and-down device 58 for moving up and down the substrate holding part 57 so as to position the substrate 1 sucked and held by the substrate holding part 57 by moving the substrate from a position for reception from the substrate conveying means 52 to a lower working position and so as to move up the substrate to a delivery position for the substrate conveying means 52 after work, in place of the moving device 18 of the first embodiment.

ACF applying device 12 and press-bonding devices 14, 15 out of the working devices 12 through 15 in the component mounting apparatus 10 of the second embodiment are practically the same as those of the first embodiment in basic configuration and operation but are different therefrom in that ACF applying units 21 and press-bonding units 24 thereof are provided in vertical postures.

Figure 7:
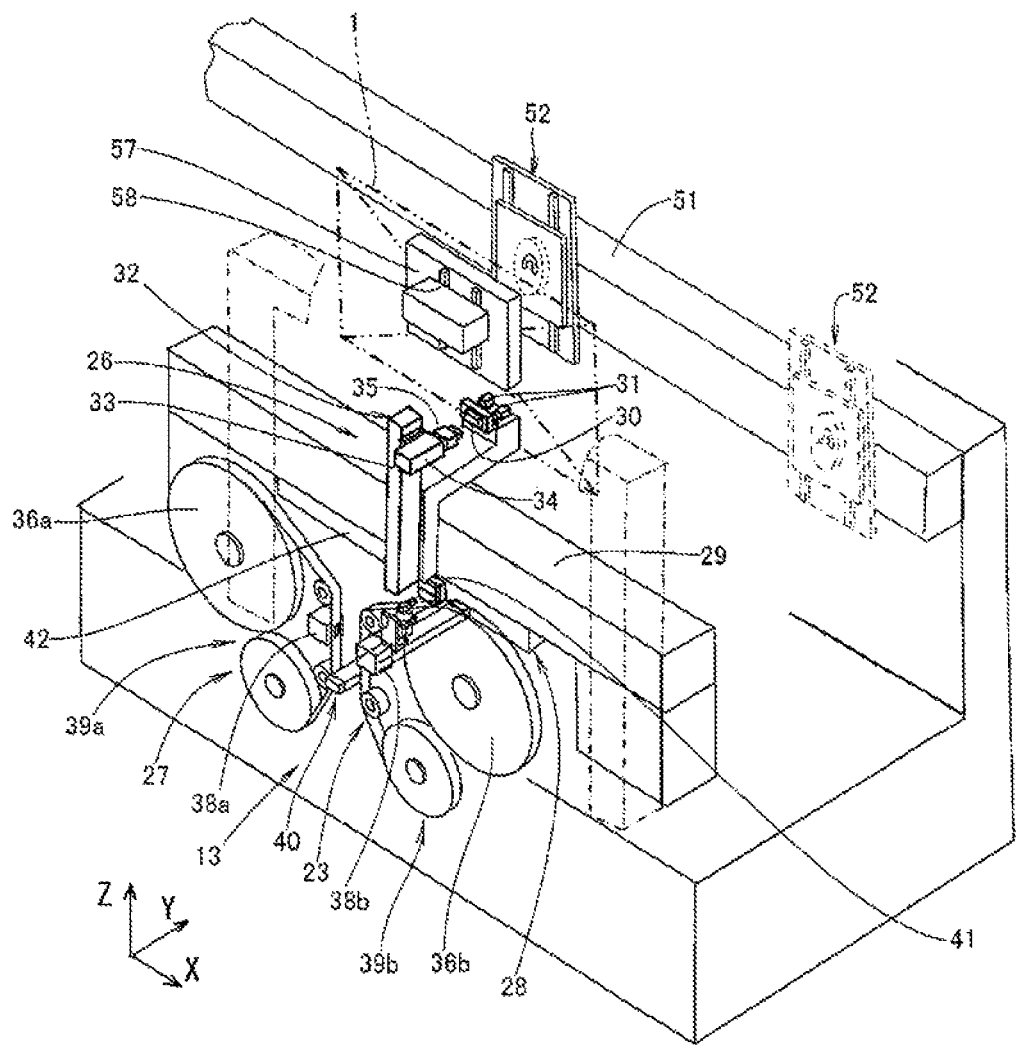
FIG. 7 is a perspective view showing a general configuration of a component placing device in accordance with the second embodiment.
Figure 8:
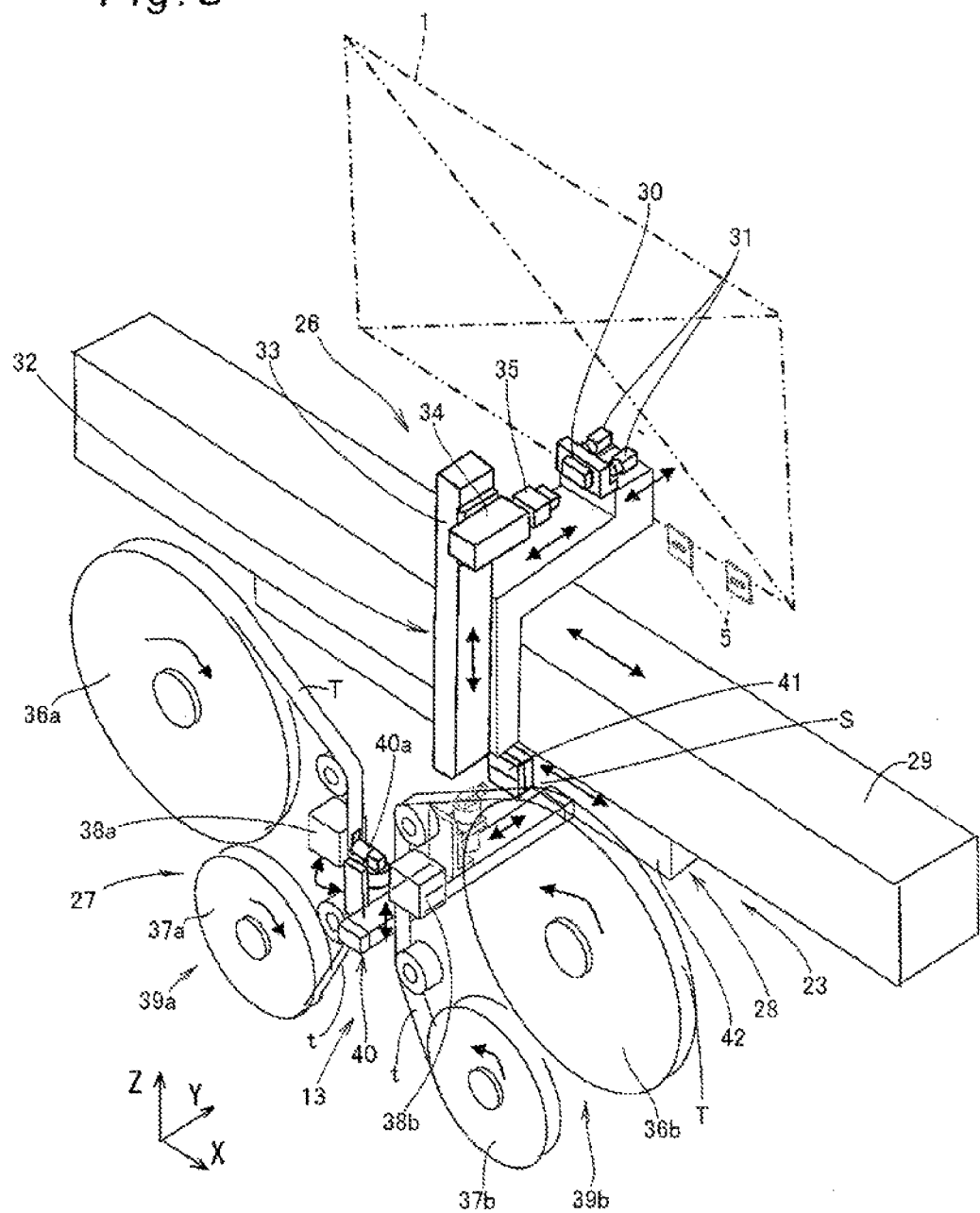
FIG. 8 is a perspective view showing a configuration of a principal part of the component placing device in accordance with the second embodiment.

As shown in FIGS. 7 and 8, a component placing device 13 has practically the same basic configuration and operation except for a difference in that the components 5 are placed in a perpendicular direction. In the component placing means 23, as shown in FIGS. 7 and 8, a receiving member 30 of the component placing unit 26 is placed so as to face lower edge part of the substrate 1, from a back surface side, that is positioned in the working position in the practically vertical posture with respect to the horizontal plane by the substrate holding part 57. The placing means 32 is configured so that the placing head 35 vertically moves between a position facing the receiving member 30 on a front surface side of the lower edge part of the substrate 1 and a component carrying unit 28 provided below.

In a component feeding unit 27, a pair of component feeding means 39a, 39b are arranged in a line along the X-direction on front side (front side in the Y-direction in FIGS. 7 and 8) of the component carrying unit 28, and the carrying means 40 is provided therebetween. The component 5 picked up by component pickup units 38a, 38b of the component feeding means 39a, 39b can be fed by the carrying means 40 to the component feeding position S set on a front face of the component carrying unit 28. The component 5 fed to the component feeding position S is sucked and held by a component holding member 41 of the component carrying unit 28 and is carried in the X-direction to the component delivery position R.

The second embodiment having an above configuration is capable of attaining functional effects similar to those of the first embodiment.

Besides, the carriage and required mounting operations are performed in a state in which the substrate 1 is set in the practically vertical posture with respect to the horizontal plane, and thus a configuration and an installation area of the apparatus can be decreased in size, in comparison with component mounting apparatuses in which the carriage and mounting operations are performed in a state in which the substrate 1 is set in the horizontal posture, so that equipment cost can substantially be reduced for the component mounting apparatus for the substrate 1 of large size, in particular.

The substrate 1, which is in the practically vertical posture with respect to the horizontal plane, has a whole surface facing in a direction orthogonal to a direction of gravity in a state in which the substrate 1 is sucked and held when being carried and subjected to the mounting operations, and thus forces of flexing or tearing off in a direction of thickness thereof hardly act thereon. Accordingly, there is no fear that an adverse influence might be exerted upon display function of the substrate 1 even if the substrate is a glass substrate for a large-size display panel, for instance. The substrate 1 is delivered in the practically vertical posture with respect to the horizontal plane between the conveyor device 11 and the component placing device 13, received in the practically vertical posture with respect to the horizontal plane by the component placing device 13, and positioned in the lower working position, and then the placing operations are performed with the mounting regions 3 on the edge part on lower edge side of the substrate 1 supported by the receiving member 30 from the back surface side. Even if the substrate 1 is of large type or thin type and has low surface rigidity, therefore, an own weight of the substrate 1 can be prevented from acting so as to flex the panel surface thereof. Therefore, flatness of the substrate 1 during the carriage and the mounting operations can be maintained without provision of a complicated mechanism for ensuring the flatness of the substrate 1 or performance of an operation of ensuring the flatness of the substrate 1. Thus the components can be placed by a simple configuration of the apparatus with a high positional accuracy onto the mounting regions 3 provided on the edge parts 2a, 2b of the substrate 1 of large or thin type having surface rigidity lower than small-size substrates have.

Third Embodiment

Hereinbelow, a third embodiment in accordance with the component mounting apparatus of the invention will be described with reference to FIGS. 10 through 18.

Figure 10:
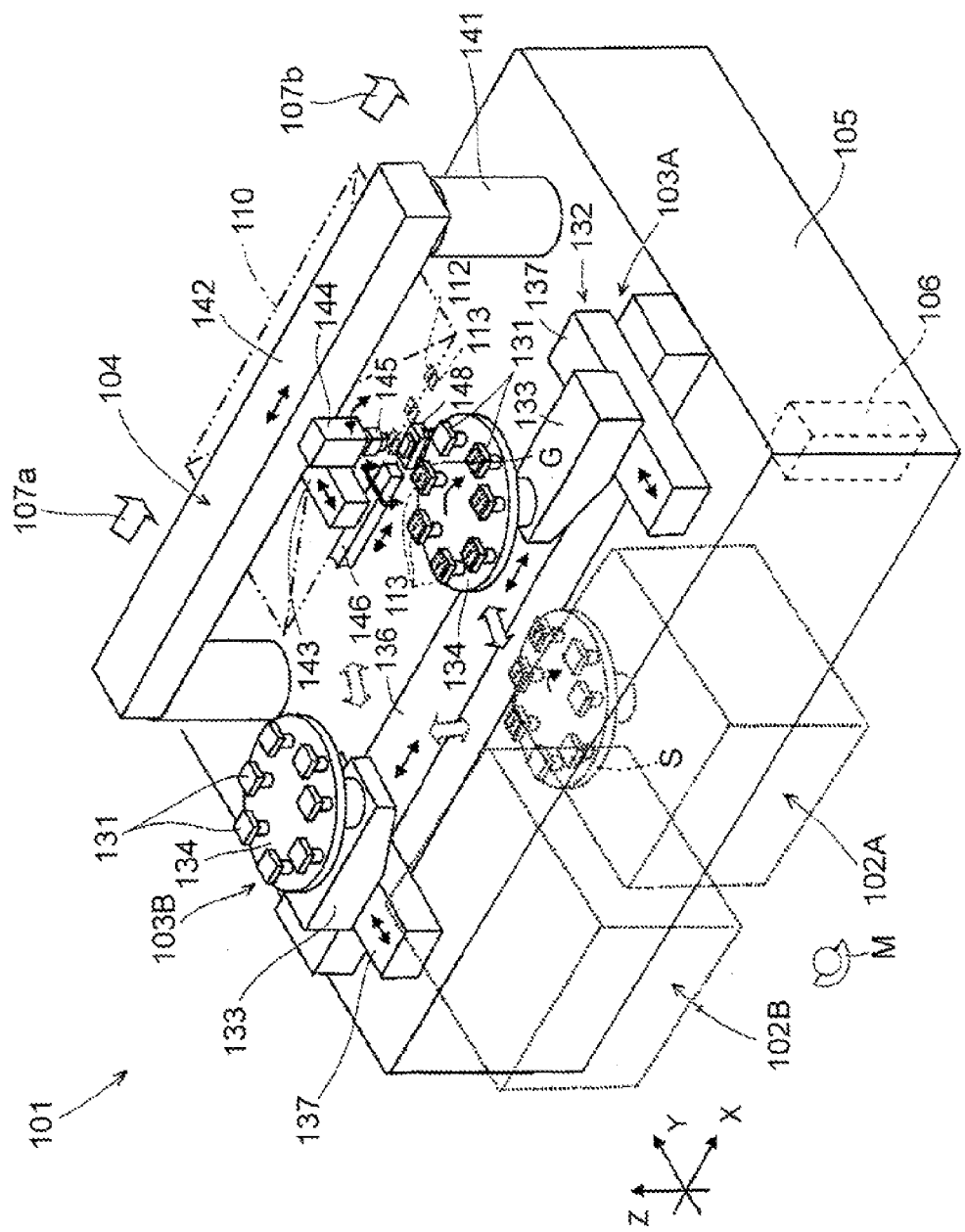
FIG. 10 is a perspective view showing a basic configuration of a component placing device in accordance with a third embodiment of the invention.
Figure 11:
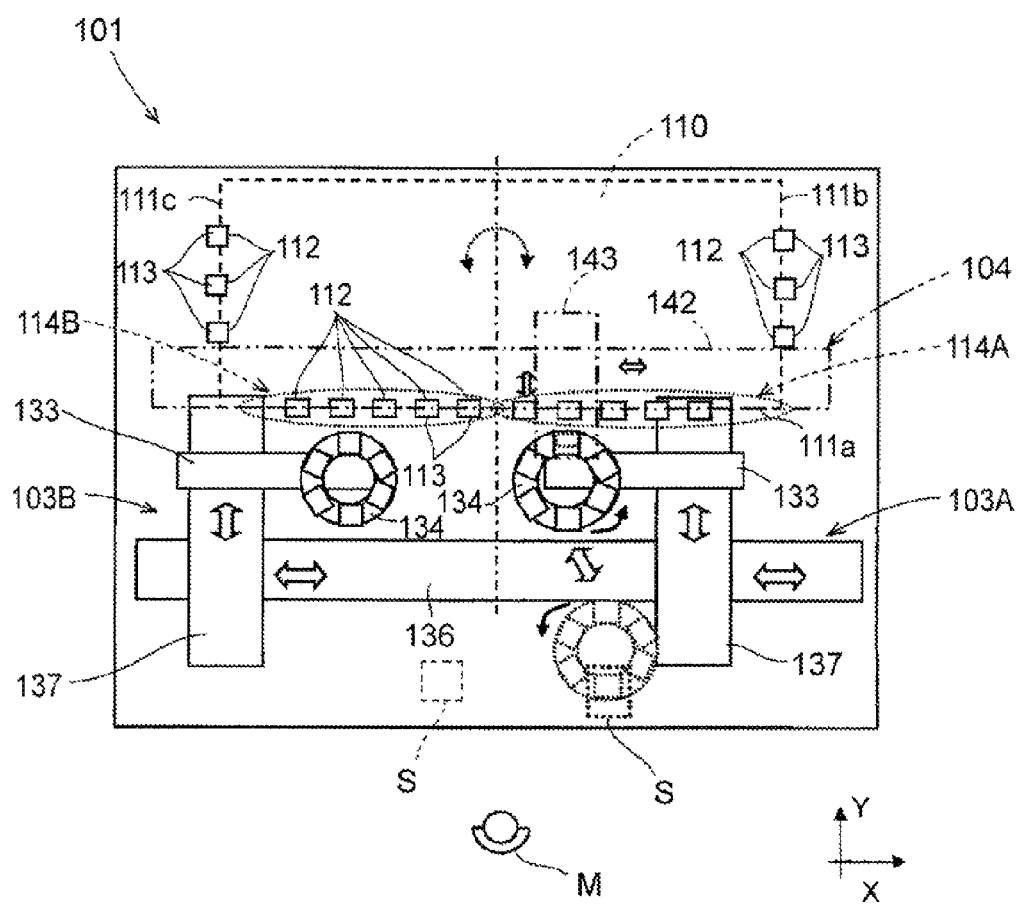
FIG. 11 is a plan view showing the basic configuration of the third embodiment.
Figure 12:
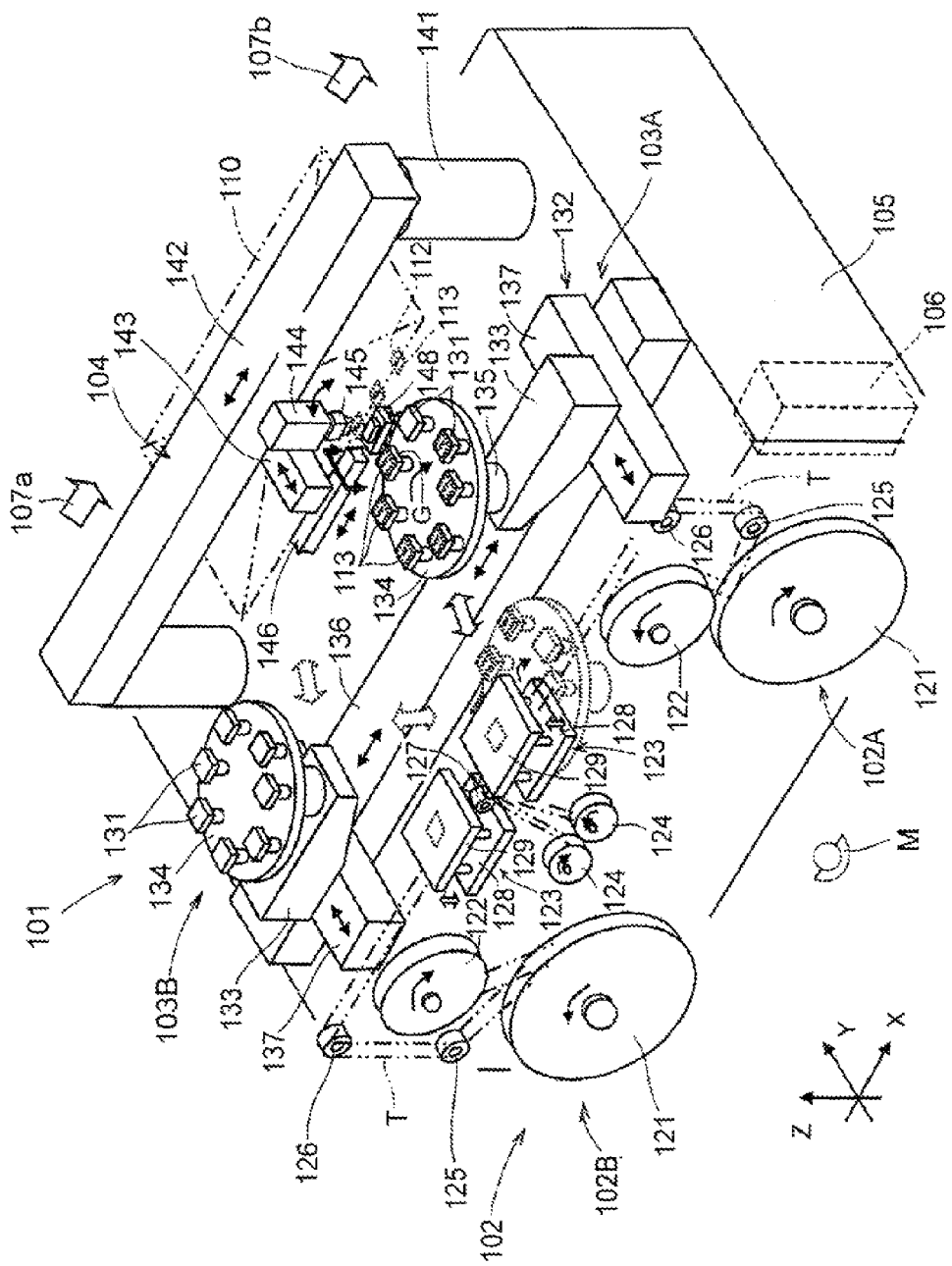
FIG. 12 is a perspective view showing a general schematic configuration of the third embodiment.
Figure 13:
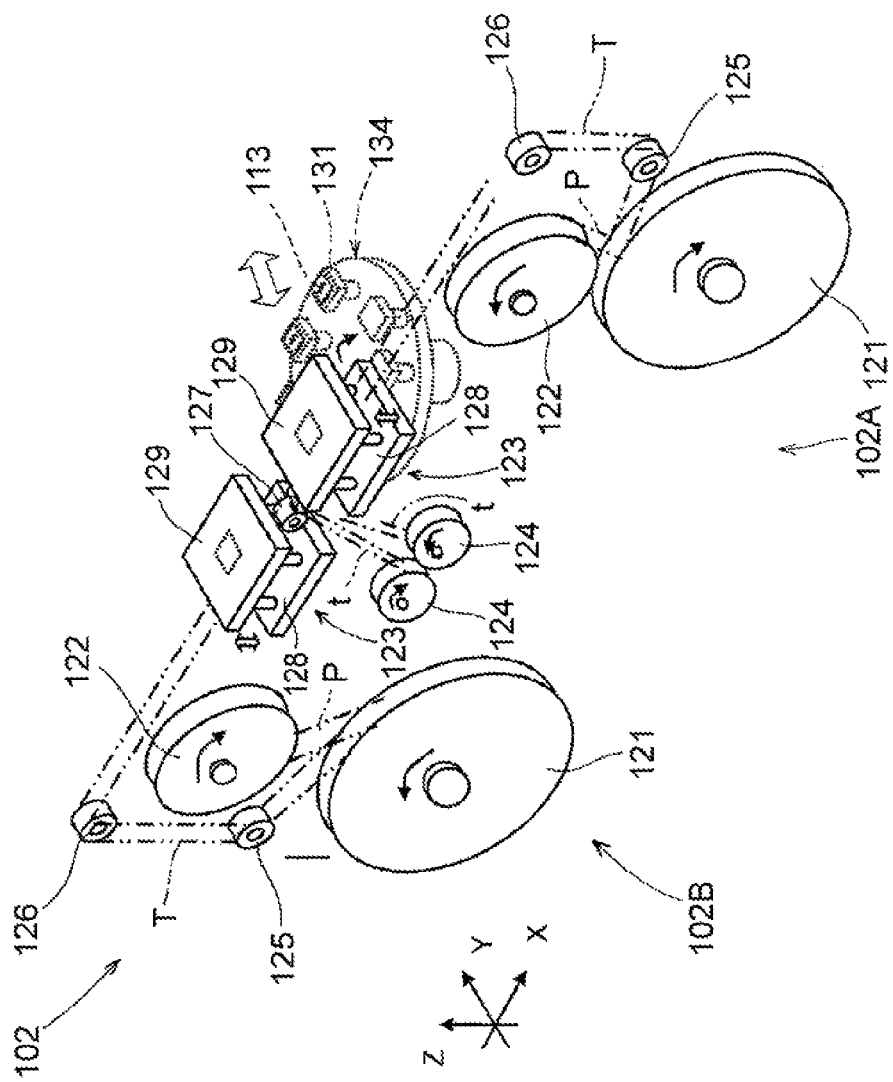
FIG. 13 is a perspective view of component feeding means in accordance with the third embodiment.

In FIGS. 10 and 11 showing a basic configuration of a component mounting apparatus of the third embodiment, reference numeral 101 denotes the component mounting apparatus. The component mounting apparatus 101 has first and second component feeding units 102A, 102B, first and second component carrying units 103A, 103B, and a component placing unit 104.

The first and second component feeding units 102A, 102B are arranged side by side in practical symmetry with respect to a center in an X-direction on front face part of a pedestal 105 in a Y-direction in front of which an operator M stands. The first and second component carrying units 103A, 103B are provided side by side in practical symmetry with respect to the center in the X-direction on front part in the Y-direction of a top surface of the pedestal 105. The component placing unit 104 is provided on rear part in the Y-direction of the top surface of the pedestal 105. In the pedestal 105 is provided a control device 106 for controlling operations of the component feeding units 102A, 102B, the component carrying units 103A, 103B, and the component placing unit 104.

On rear part in the Y-direction of the pedestal 105 are provided carrying means (not shown) for carrying a substrate 110 that is an object for mounting in the X-direction that is a substrate conveyance direction and carrying the substrate 110 into and out of the component mounting apparatus 101 as shown by arrows 107a, 107b in FIG. 10 and substrate positioning means 108 (see FIG. 16) for directing one edge part or a plurality of (three in a shown example) edge parts 111a through 111c of the substrate 110, carried into the component mounting apparatus 101, to front side in the Y-direction (side of the operator M) and positioning the edge parts in a specified position for component mounting operations. The substrate 110 in the third embodiment is a glass substrate that is formed of two glass plates being in shape of rectangles with sides having lengths on the order of several hundred millimeters to two thousand millimeters, having thicknesses on the order of 0.5 to 0.7 mm, and applied together, and a plurality of connection electrode parts in which connection electrodes comprising a large number of transparent electrodes are arranged with minute pitches are arranged at intervals on an inside surface of protruding one of the glass plates, on the edge parts 111a through 111c thereof. The connection electrode parts form mounting regions 112 on which components 113 are to be mounted.

The first and second component feeding units 102A, 102B feed the components 113 to a component feeding position S set in one specified position or component feeding positions S set in specified positions for the component feeding units 102A, 102B, respectively. Configurations of the component feeding units 102A, 102B in the third embodiment will be described with reference to FIGS. 12 and 13.

The component feeding units 102A, 102B have shapes practically symmetrical with respect to the center in the X-direction along the conveyance direction for the substrate 10 on the front face part of the pedestal 105, have basically the same configuration, and thus will be described collectively. The components 113 are in form of tape-like component assemblies T in which a large number of components 113 are housed and held on long carrier tapes t, and are fed from feeding reels 121 on which the carrier tapes t having surfaces covered with protection tapes p are wound. In the component feeding units 102A, 102B, the tape-like component assemblies T are drawn out of the feeding reels 121 provided along the X-direction, the protection tapes p on the surfaces are peeled off, and the protection tapes p peeled off are wound on protection tape collecting reels 122 provided along the X-direction. After that, a series of operations in which the tape-like component assemblies T with the protection tapes p peeled off therefrom are forwarded to component pickup units 123, in which the components 113 are picked up by punching in the component pickup units 123, and in which the remaining carrier tapes t are wound on takeup reels 124 provided along the X-direction are performed in the component feeding units 102A, 102B.

In the component feeding units 102A, 102B, the feeding reels 121 are placed on lower side of positions distant from the center in the X-direction on the front face part of the pedestal 105, and the protection tape collecting reels 122 and guide rollers 125 are placed on upper side thereof. The protection tape collecting reels 122 are placed on a side near to the center in the X-direction and the guide rollers 125 are placed at a distance from each other on sides distant from the center in the X-direction. On upper part of the front face part of the pedestal 105, the component pickup units 123 are placed on positions near to the center in the X-direction, guide rollers 126 are placed in positions above the guide rollers 125 that are distant from the center in the X-direction, and guide rollers 127 are placed in positions nearer to the center in the X-direction than the component pickup units 123. In the component feeding units 102A, 102B with such a configuration, the tape-like component assemblies T having passed through the guide rollers 126 run horizontally in the X-direction toward the component pickup units 123, and the carrier tapes t ejected from the component pickup units 123 pass through the guide rollers 127 and are wound on the takeup reels 124 provided under the component pickup units 123.

The component pickup units 123 have lower fixed dies 128 and upper movable punches 129, the tape-like component assemblies T are punched from above by the movable punches 129, and thus the components 113 separated from the carrier tapes t can be picked up through and from below the fixed dies 128 by the component carrying units 103A, 103B.

Hereinbelow, the component carrying units 103A, 103B will be described. As shown in FIGS. 10 through 12 and FIGS. 14 through 16, the component carrying units 103A, 103B have shapes practically symmetrical with respect to the center in the X-direction along the substrate conveyance direction for the substrate 110, both the units have basically the same configuration, and thus configurations of the component carrying units 103A, 103B will be described collectively. The component carrying units 103A, 103B are configured so as to sequentially hold the plurality of components 113, fed to the component feeding positions S, by a plurality of component holding members 131, to horizontally move, and to sequentially deliver the held components 113 to desired component delivery positions G movable in the substrate conveyance direction.

In each of the component carrying units 103A, 1036, specifically, a rotating plate 134 is provided on a movable member 133 of a two-axis robot 132 (holding member moving device) that can be moved and positioned in two directions of the X-direction that is the substrate conveyance direction for the substrate 110 and the Y-direction that is orthogonal to the substrate conveyance direction, and the plurality of component holding members 131 for sucking and holding the components 113 are provided on outer circumferential part of the rotating plate 134 so as to be capable of moving up and down. The rotating plate 134 is configured so as to be capable of intermittently rotating at intervals of a placement pitch of the component holding members 131 by a rotating positioning device 135. The two-axis robot 132 has an X-axis table 136 that is provided so as to extend over a whole length along the X-direction of the pedestal 105 in general and that is common to the plurality of component carrying units 103A, 103B, and Y-axis tables 137, 137 placed on the X-axis table 136 separately for the component carrying units 103A, 103B, and the robot is configured so as to be capable of moving and positioning the movable member 133 in the X-direction and the Y-direction. The movable members 133 each have a shape overhanging and protruding toward the opposite component carrying unit 103A, 103B, and the rotating plates 134 are provided through the rotating positioning devices 135 on extremity parts of the overhanging and protruding movable members 133. In such a configuration, a desired component holding member 131 on either desired one of the rotating plates 134 in the component carrying units 103A, 103B can be positioned in the component feeding position S under either desired one of the component pickup units 123 in the component carrying units 103A, 103B, and the component 113 can be received and held with an up-and-down operation of the component holding member 131. An operation by one component carrying unit 103A of sequentially delivering the components 113 in any desired one of component delivery positions G from the plurality of component holding members 131 of the component carrying unit 103A to an placing head 144 of the component placing unit 104 can be performed in parallel with an operation of sequentially causing the plurality of component holding members 131 of the other component carrying unit 103B to hold the components 113, fed from the component pickup unit 123 of the first component feeding unit 102A or the second component feeding unit 102B, in the component feeding position S.

Hereinbelow, the component placing unit 104 will be described. In the component placing unit 104, as shown in FIGS. 10 through 12 and FIGS. 14 through 16, an X-axis table 142 (first direction moving device) that extends along the X-direction above a top surface of the pedestal 105 is configured by a gate-shaped frame 141 provided on the top surface of the pedestal 105, and a Y-axis table 143 (second direction moving device) that extends along the Y-direction is provided on lower part of the X-axis table 142. By the X-axis table 142 and the Y-axis table 143, the placing head 144 can be moved along the edge part of the substrate 110 along the X-direction that is the substrate conveyance direction for the substrate 110 positioned in a specified position, and can sequentially be positioned in mounting working positions (component placing positions) corresponding to mounting regions 112 of the substrate 110. Furthermore, the placing head 144 can be reciprocated between the mounting regions 112 and the component delivery positions G set in nearby positions spaced from the mounting regions 112 in the Y-direction. On the placing head 144, a placing tool 145 for sucking and holding the component 113 is provided so as to be capable of moving up and down and rotating about a vertical Z-axis. The placing tool 145 is configured so as to receive the component 113 in the component delivery position G and move up, move at least in the Y-axis direction to the mounting working position just over the mounting region 112, move down with correction of a rotation position, and place the component 113 onto the mounting region 112.

The X-axis table 146 is placed under the edge parts 111a through 111c of the substrate 110 positioned in the specified position. On a movable member 147 that can be moved and positioned in the X-direction by the X-axis table 146, an under receiving member 148 is provided so as to be capable of moving up and down between a support position and a withdrawal position on lower side so that the member supports the edge parts 111a through 111c of the substrate 110 from below when the components 113 are placed onto the mounting regions 112. There is provided a recognition camera 149 for performing image recognition of positions of the mounting regions 112 on the substrate 110 and the components 113 with a high accuracy.

The substrate positioning means 108 has an X-axis table 151 for positioning the substrate 110 that has been carried in, in the X-direction, a Y-axis table 152 that is provided on the X-axis table 151 for placing the edge parts 111a through 111c of the substrate 110 on the under receiving member 148 and moving the edge parts between the component placing position where the components 113 are placed onto the component placing unit 104 and a withdrawal position against the component placing position, rotating positioning means 153 provided on the Y-axis table 152, and an up-and-down device 154 provided thereon, and is capable of moving and positioning a substrate holding part 155, for sucking and holding practically center part of the substrate 110, in the X, Y, Z, and θ-directions.

Figure 17:
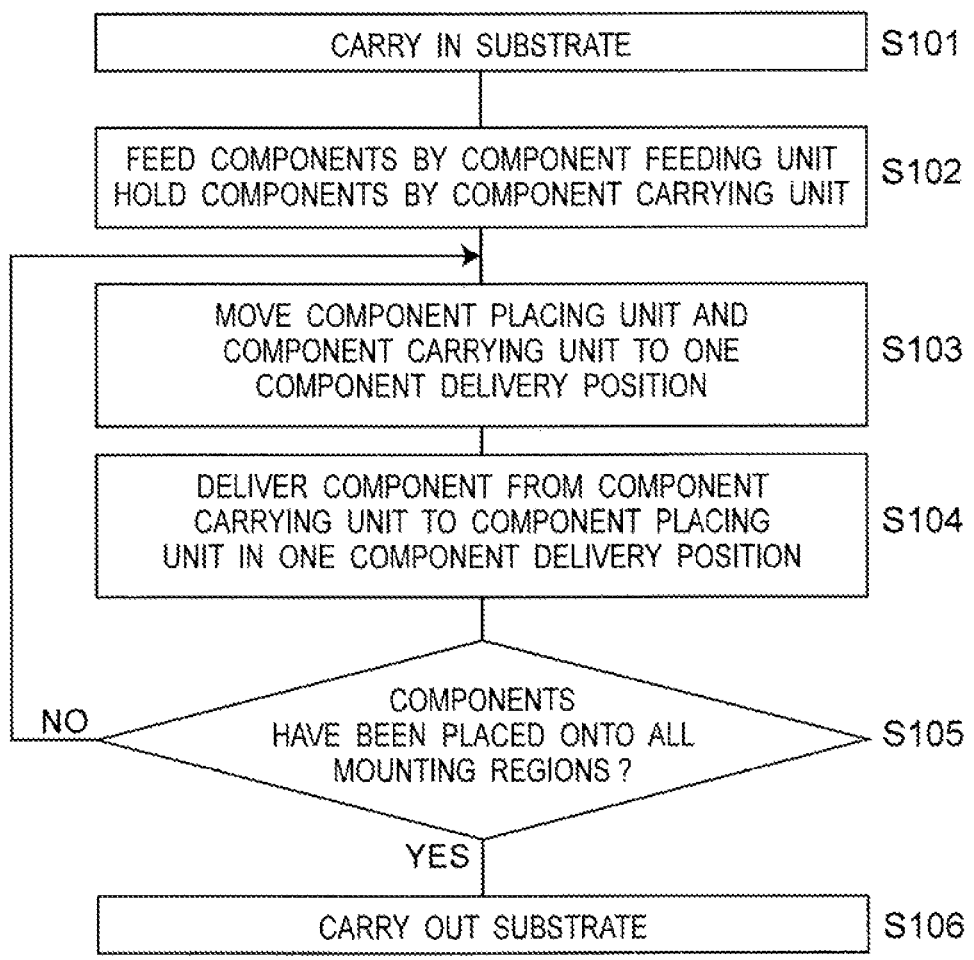
FIG. 17 is an operation flow chart for the component placing device in accordance with the third embodiment.

Hereinbelow, operations of placing the components 113 onto the plurality of mounting regions 112, provided on the edge part 111a of the substrate 110, by the component mounting apparatus 101 having an above configuration will be described with reference to operation flowcharts shown in FIGS. 17, 18. The operations of the component mounting apparatus 101 that will be described below are performed with the control device 106 generally controlling over operations of the component devices while relating the operations to one another.

Initially, an operation of placing the components 113 onto the plurality of mounting regions 112 on the edge parts of the substrate 110 by the first or second component feeding unit 102A or 102B, the first or second component carrying unit 103A or 103B, and the component placing unit 104 will be described with reference to the operation flowchart of FIG. 17. In the description below, the first and second component feeding units 102A and 102B will be referred to as "component feeding unit 102" unless either one of the units is referred to with specification and the first and second component carrying units 103A and 103B will be referred to as "component carrying unit 103" unless either one of the units is referred to with specification.

Once the substrate 110 is carried into the component mounting apparatus 101 (step S101), a required number of components 131 are picked up in series by the component pickup units 123 of the component feeding unit 102 and are sequentially held on the component holding members 131 by intermittent rotation of the rotating plates 134 of the component carrying unit 103 (step S102).

As the component placing unit 104 subsequently moves to one component delivery position G out of the component delivery positions G set in vicinity of the mounting regions 112 of the substrate 110 in order to mount the component 113 on the mounting region 112 of the substrate 110, the component carrying unit 103 moves to position one component holding member 131 out of the component holding members 131 of the component carrying unit 103 in the one component delivery position G (step S103). The component delivery positions G are arranged along the X-direction that is the substrate conveyance direction.

Subsequently, the component placing unit 104 receives the component 113 from the component holding member 131 of the component carrying unit 103 in the component delivery position G, thereafter moves toward the mounting working position in the Y-direction, and places the component 113 onto the mounting region 112 on the substrate 110 (step S104). Operations of the steps S103, S104 are repeated until placement of the components 113 onto all the mounting regions 112 on the edge part of the substrate 110 is completed (steps S105). Upon completion of the placement of the components 113 onto all the mounting regions 112, the substrate 110 is carried out (steps S106).

The operations of placing the components have been described with reference to an example in which the components of single type are placed onto one edge part 111a of the substrate 110. On condition that a number of the mounting regions 112 existing on the edge part 111a of the substrate 110 is smaller than that of the component holding members 131 provided on one component carrying unit 103, the placement of the components is performed with use of one component feeding unit 102 and one component carrying unit 103.

On condition that different components are placed onto the edge part 111a on the long side (source side) of the substrate 110 and onto the edge part 111b or 111c on the short side (gate side) thereof, the feeding reels 121 on which tape-like component assemblies T holding a large number of components 113 on the source side and on the gate side are wound are placed to the first and second component feeding units 102A and 102B, respectively, and the components 113 are sequentially placed onto the mounting regions 112 on the edge part 111a on the long side (source side) by the placing operation with use of the first component feeding unit 102A, the first component carrying unit 103A, and the component placing unit 104. After that, the substrate 110 is turned by the substrate positioning means 108 so that the edge part 111b or 111c on the short side (gate side) is positioned in the component placing position, and the components 113 are sequentially placed onto the mounting regions 112 on the edge part 111b or 111c on the short side (gate side) by the placing operation with use of the second component feeding unit 102B, the second component carrying unit 103B, and the component placing unit 104. Upon completion of the placement of the components 113 onto all the mounting regions 112, the substrate 110 is carried out.

Figure 14:
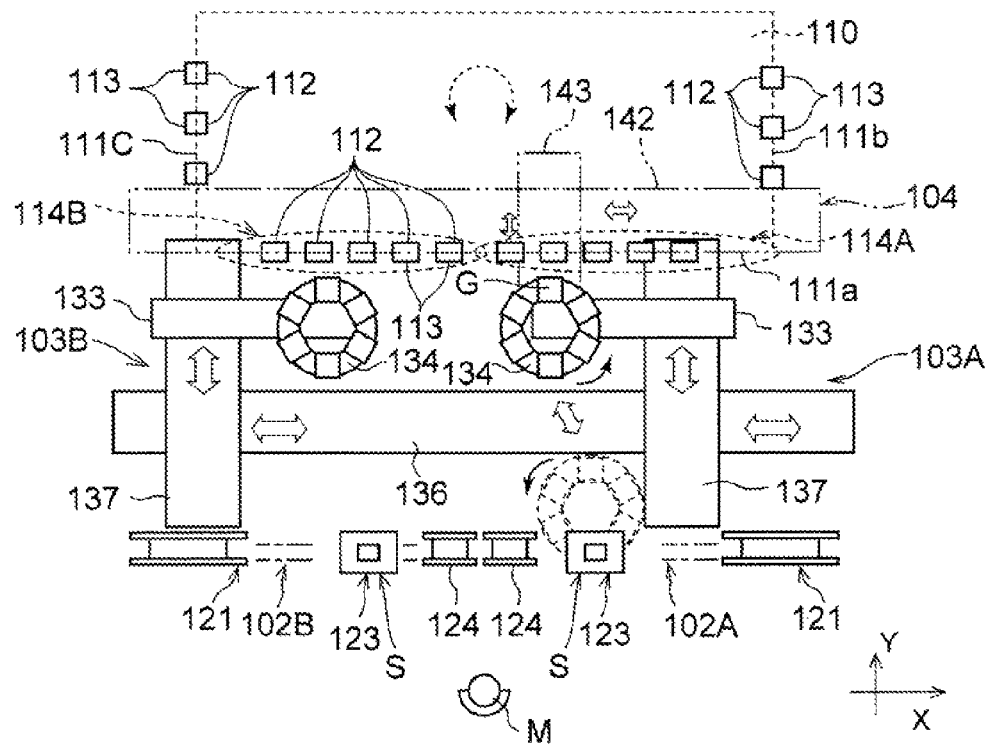
FIG. 14 is a plan view showing the general schematic configuration of the third embodiment.
Figure 15:
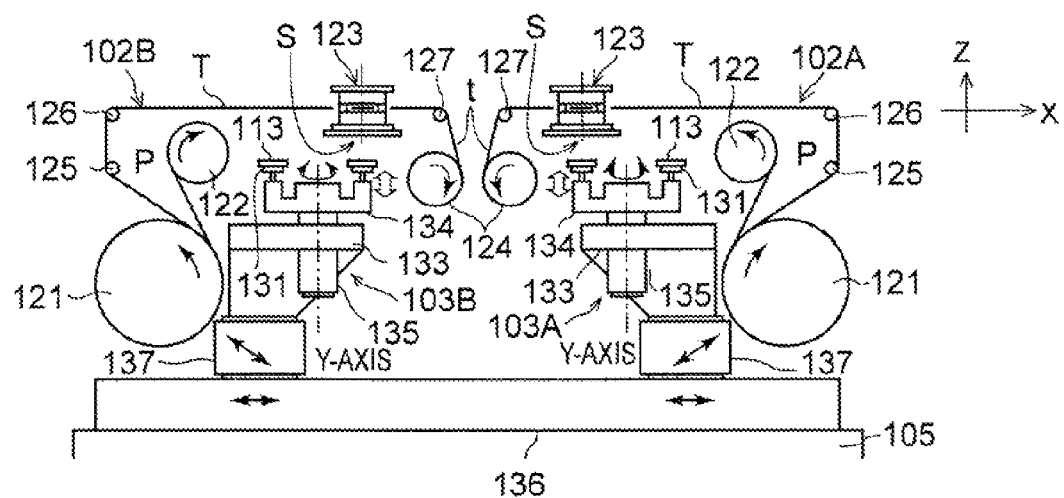
FIG. 15 is a front view showing a configuration of a principal part of the third embodiment.
Figure 16:
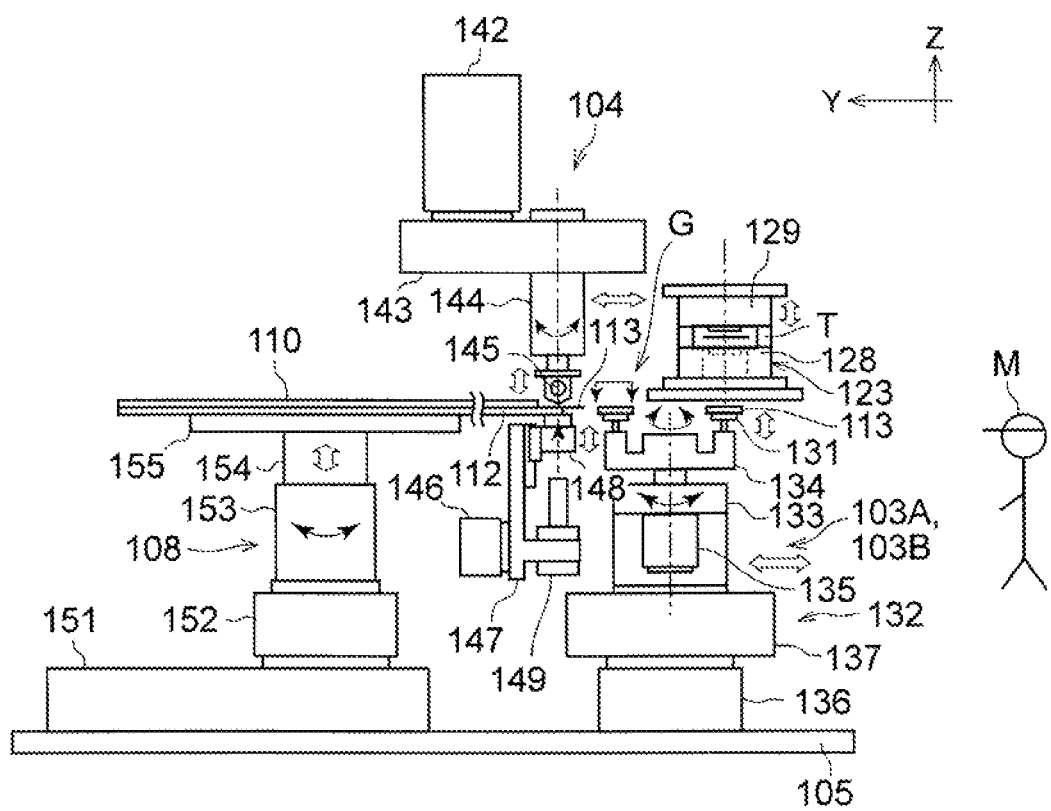
FIG. 16 is a side view for illustrating an operation step in the third embodiment.

Subsequently, component placing operations in which the number of the mounting regions 112 existing on the edge part 111a on the long side (source side) of the substrate 110 is larger than that of the component holding members 131 provided on the component carrying unit 103A or 103B will be described with reference to FIGS. 14 and 18. In this case, an area on the edge part 111a where the mounting regions 112 are provided is divided into a first mounting area 114A and a second mounting area 114B, as shown in FIG. 14, the first component carrying unit 103A is used for placement of the components onto the plurality of mounting regions 112 in the first mounting area 114A, and the second component carrying unit 103B is used for placement of the components onto the plurality of mounting regions 112 in the second mounting area 114B.

The component placing operations will be described with reference to the operation flowchart of FIG. 18. Once the substrate 110 is carried into the component mounting apparatus 101 (step S111), a required number of components 131 are picked up in series by the component pickup unit 123 of the first component feeding unit 102A and are sequentially held on the component holding members 131 by intermittent rotation of the rotating plate 134 of the first component carrying unit 103A (step S112).

Subsequently, the component placing unit 104 sequentially moves to a mounting working position corresponding to a mounting region 112 in the first mounting area 114A of the substrate 110 in order to mount the component 113 on the mounting region 112. Following the operation, the first component carrying unit 103A moves to position a component holding member 131 of the first component carrying unit 103A in the component delivery position G set in vicinity of the mounting region 112 of the substrate 110 (step S113).

Subsequently, the component placing unit 104 receives the component 113 from the component holding member 131 of the first component carrying unit 103A positioned in the component delivery position G, and places the component 113 onto the mounting region 112 in the first mounting area 114A on the substrate 110 (step S114). Operations of the steps S113, S114 are repeated until placement of the components 113 onto all the mounting regions 112 in the first mounting area 114A is completed (step S115).

While the steps S112, S113, S114, and S115 are performed, a required number of components 131 are picked up in series by the component pickup unit 123 of at least the first component feeding unit 102A and are sequentially held on the component holding members 131 by intermittent rotation of the rotating plate 134 of the second component carrying unit 103B (step S116). If it is determined in the step S115 that the placement of the components 113 onto all the mounting regions 112 in the first mounting area 114A is completed, the component placing unit 104 sequentially moves to a mounting working position corresponding to a mounting region 112 in the second mounting area 114B of the substrate 110 in order to mount the component 113 on the mounting region 112. Following the operation, the second component carrying unit 103B moves to sequentially position a component holding member 131 of the second component carrying unit 103b in the component delivery position G set in vicinity of the mounting region 112 of the substrate 110 (step S117).

Subsequently, the component placing unit 104 receives the component 113 from the component holding member 131 in the component delivery position G, and places the component 113 onto the mounting region 112 in the second mounting area 114B on the substrate 110 (step S118). Operations of the steps S117, S118 are repeated until placement of the components 113 onto all the mounting regions 112 in the second mounting area 114B is completed (step S119). Upon completion of the placement onto all the mounting regions 112 in the second mounting area 114B, the substrate 110 is carried out (steps S120).

Figure 18:
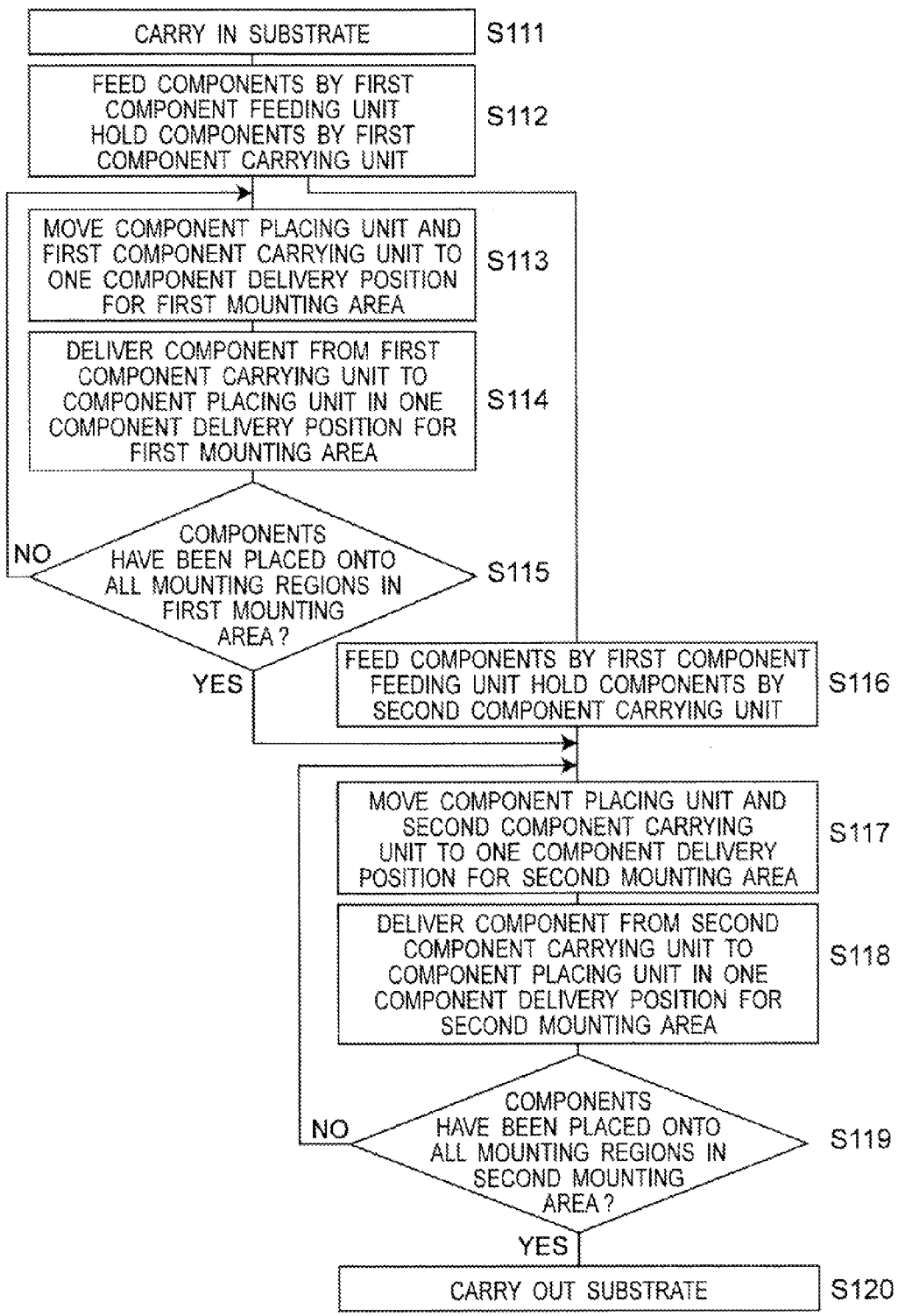
FIG. 18 is an operation flow chart for the component placing device in accordance with the third embodiment.

In an example shown in the operation flow chart of FIG. 18, a configuration in which the components 113 to be mounted on the mounting regions 112 on the edge part 111a on the long side (source side) of the substrate 110 are fed only from the first component feeding unit 102A has been described as one example, on an assumption that the first component feeding unit 102A is replaced while the components 113 are fed from the second component feeding unit 102B once the components 113 in the first component feeding unit 102A are used up. Alternatively, a configuration may be employed in which the components 113 may be fed from either of the component feeding units 102A, 102B. Provided that different components are placed onto the edge part 111a on the long side (source side) of the substrate 110 and onto the edge part 111b or 111c on the short side (gate side) thereof, the same component placing operations as described above have only to be performed with the components 113 on the source side and on the gate side fed by the first and second component feeding units 102A and 102B, respectively.

In the third embodiment is employed a configuration in which the feeding reels 121 and the takeup reels 124 of the component feeding units 102A, 102B are provided in postures along the X-direction that is the conveyance direction for the substrate 110 and in which the component pickup units 123 are placed between the reels 121, 124. Accordingly, the component feeding units 102A, 102B can be configured compactly in the Y-direction (i.e., direction of widths of the feeding reels 121) orthogonal to the X-direction so that an occupied area thereof in plan view can be decreased even if increase in a quantity of the components 113 housed in the tape-like component assemblies T causes increase in diameters of the feeding reels 121. The configuration of the apparatus can be made compact for the substrate 110 having a large size, in particular, because the operations of placing the components 113 are performed not with movement of the substrate 110 but with movement of the component placing unit 104 to the mounting working positions corresponding to the mounting regions 112 of the substrate 110 in a state in which the substrate 110 is positioned in the specified position (that is, a state in which a position thereof is fixed).

The components 113 picked up in series by the component pickup units 123 of the component feeding units 102A, 102B are sequentially held on the plurality of component holding members 131 of the component carrying units 103A, 103B, the component placing unit 104 is moved to the mounting working positions in accordance with the positions where the mounting regions 112 on the substrate 110 are provided, in the placement of the components, and the components 113 are sequentially delivered to the component delivery positions G by the component carrying units 103A, 103B. In the component placing unit 104, the placing head 144 moves at least in the Y-direction by a short distance between the mounting regions 112 on the substrate 110 that are along the substrate conveyance direction and the component delivery positions G set with spacing in the Y-direction, and places the components 113 onto the mounting regions 112. Therefore, time for the placement of the components 113 on the mounting regions 112 can be curtailed, even for the substrate 110 having a large size and large intervals between the adjoining mounting regions 112, and the components can be placed onto the substrate 110 having the large size with satisfactory working efficiency.

There is employed a configuration in which the plurality of component feeding units 102A, 102B and the plurality of component carrying units 103A, 103B are provided so as to adjoin in the substrate conveyance direction. In the configuration, components 113 held by either one component carrying unit 103A (103B) can be delivered to the component placing unit 104 in the component delivery positions G and the components 113 can be placed onto the mounting regions 112 by the component placing unit 104 while components 113 are made to be held by the other component carrying unit 103B (103A) from any desired component feeding unit 102A, 102B. Accordingly, the efficiency of the operations of placing the components 113 can further be improved. When the components 113 of different types are fed from the plurality of component feeding units 102A, 102B and the different components 113 are placed onto the mounting regions 112 on the plurality of edge parts 111a through 111c of the substrate 110, the components can be placed by the single component mounting apparatus 101.

In the component carrying unit 103A, 103B, the rotating plate 134 is provided on the movable member 133 of the two-axis robot 132 that can be moved and positioned in the two directions of the X-axis direction that is the substrate conveyance direction and the Y-axis direction that is orthogonal to the substrate conveyance direction, the plurality of component holding members 131 are provided on the outer circumferential part of the rotating plate 134, and the rotating plate 134 is configured so as to be intermittently rotatable at the intervals of the placement pitch of the component holding members 131 by the rotating positioning device 135. In such a configuration, a large number of component holding members 131 can be provided in the compact configuration, and the intermittent rotation of the rotating plate 134 makes it possible to sequentially place the plurality of component holding members 131 in the specified positions in short tact time. A combination of the rotating plates 134 and the two-axis robot 132 makes it possible to position the component holding members 131 in the component feeding positions S for the component pickup units 123 of the component feeding units 102A, 102B and in the component delivery positions G for the component placing unit 104 and improves the efficiency of the operations.

For the plurality of component carrying units 103A, 103B is employed a configuration in which the movable member 133 of the two-axis robot 132 has a shape overhanging and protruding toward the opposite movable member and in which the rotating plate 134 is provided on the extremity part of the movable member 133. In such a configuration, the operations by one component carrying unit 103A of sequentially delivering the components 113 in the component delivery positions G from the plurality of component holding members 131 to the placing head 144 of the component placing unit 104 can be performed in parallel with the operations of sequentially causing the plurality of component holding members 131 of the other component carrying unit 103B to hold the components 113, fed from the component pickup units 123 of the component feeding unit 102A, 102B, in the component feeding positions S. When components 113 are delivered from the one component carrying unit 103A to the component placing unit 104, accordingly, the other component carrying unit 103B is capable of holding components 113 from any of the component pickup units 123 of the component feeding units 102A, 102B while being prevented from interfering with the one component carrying unit 103A. Thus the components 113 can be made to be held by the other component carrying unit 103B while the one component carrying unit 103A engages in the operations of placing the components 113, so that the efficiency of the operations can be improved.

Fourth Embodiment

Figure 19A:
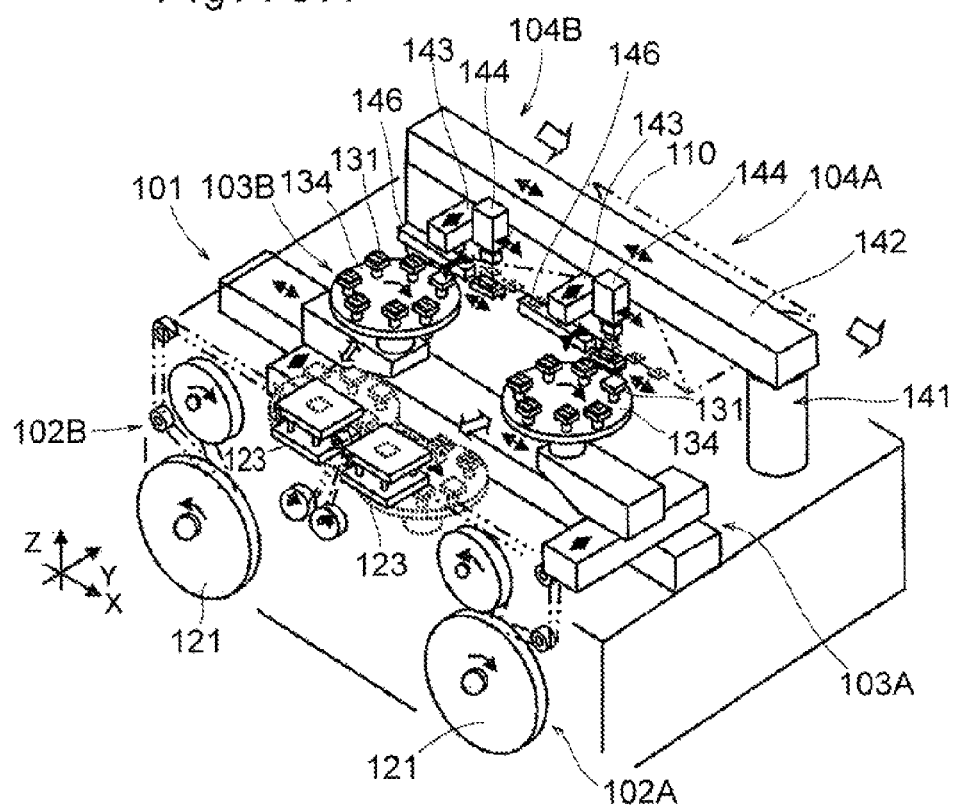
FIG. 19A is a perspective view showing a general schematic configuration of a component placing device in accordance with a fourth embodiment of the invention.
Figure 19B:
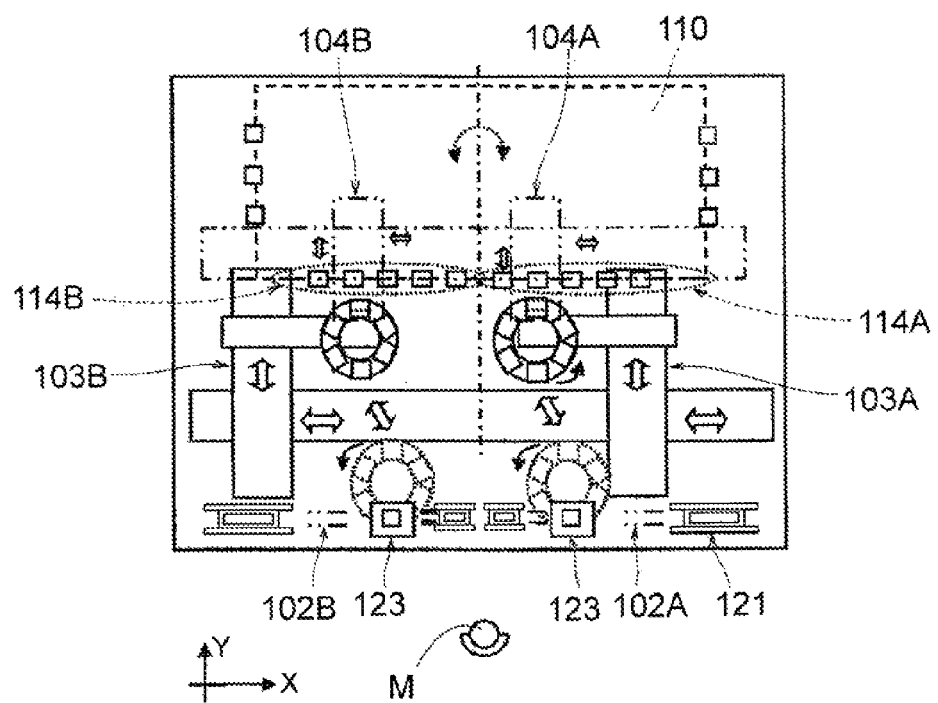
FIG. 19B is a plan view of the fourth embodiment.

Hereinbelow, a fourth embodiment in accordance with the component mounting apparatus of the invention will be described with reference to FIGS. 19A, 19B. In description on the embodiment below, the same components as those of the precedent third embodiment will be provided with the same reference characters, description thereof will be omitted, and only differences will be described in general.

The configuration having the single component placing unit 104 has been described as an example for the component mounting apparatus 101 of the third embodiment, whereas the fourth embodiment has a first component placing unit 104A and a second component placing unit 104B, so that components 113 are placed simultaneously in parallel onto mounting regions 112 in a plurality of mounting areas 114A, 114B on a substrate 110 by the plurality of component placing units 104A, 104B, respectively. Specifically, the first and second component placing units 104A, 1046 share a gate-shaped frame 141 and an X-axis table 142, and each has a configuration having an X-axis table 146, a Y-axis table 143, a placing head 144, and a movable part 147.

In the fourth embodiment, the components 113 can be placed simultaneously in parallel onto the plurality of mounting areas 114A, 114B by the plurality of component placing units 104A, 104B, and thus efficiency of component placing operations can further be improved.

Fifth Embodiment

Hereinbelow, a fifth embodiment in accordance with the component mounting apparatus of the invention will be described with reference to FIGS. 20 through 22.

For the first and second component feeding units 102A, 102B in the component mounting apparatus 101 of the third embodiment, the example has been described in which the feeding reels 121 are placed on lower side of the positions distant from the center of the pedestal 105 in the X-direction on the front face part of the pedestal 105 on front side in the Y-direction (side of the operator M) and in which the protection tape collecting reels 122 are placed on upper side thereof and on the side near to the center of the pedestal 105 in the X-direction. In place of such an example of configuration, the fifth embodiment employs a configuration in which protection tape collecting reels 122 are arranged so as to coaxially overlap feeding reels 121 in a Y-direction. In the configuration, a protection tape p peeled off from a tape-like component assembly T drawn out of the feeding reel 121 can be shifted in a direction of tape width (i.e., Y-direction) by one diagonal roller or a plurality of diagonal rollers 161 and can be wound on the protection tape collecting reel 122. The one diagonal roller or the plurality of diagonal rollers 161 form a tape running path shifting part 160 for shifting a running path of the protection tape p in the direction of tape width.

The protection tapes p cover from above and protect the components 113 held by carrier tapes t, thus have certain thicknesses for cushion property, and require a large reel diameter equivalent to that of the protection tape collecting reels 122. Therefore, the feeding reels 121 and the protection tape collecting reels 122 provided in the same plane occupy a large space on the front face part of the pedestal 105 in front view in the Y-direction. In the fifth embodiment, the feeding reels 121 and the protection tape collecting reels 122 are placed so as to coaxially overlap, thus saving of space can be attained, and the first and second component feeding units 102A, 102B can be made compact.

Modification of Fifth Embodiment

Hereinbelow, a component mounting apparatus in accordance with a modification of the fifth embodiment will be described with reference to schematic diagrams of FIGS. 32 through 35.

Figure 20:
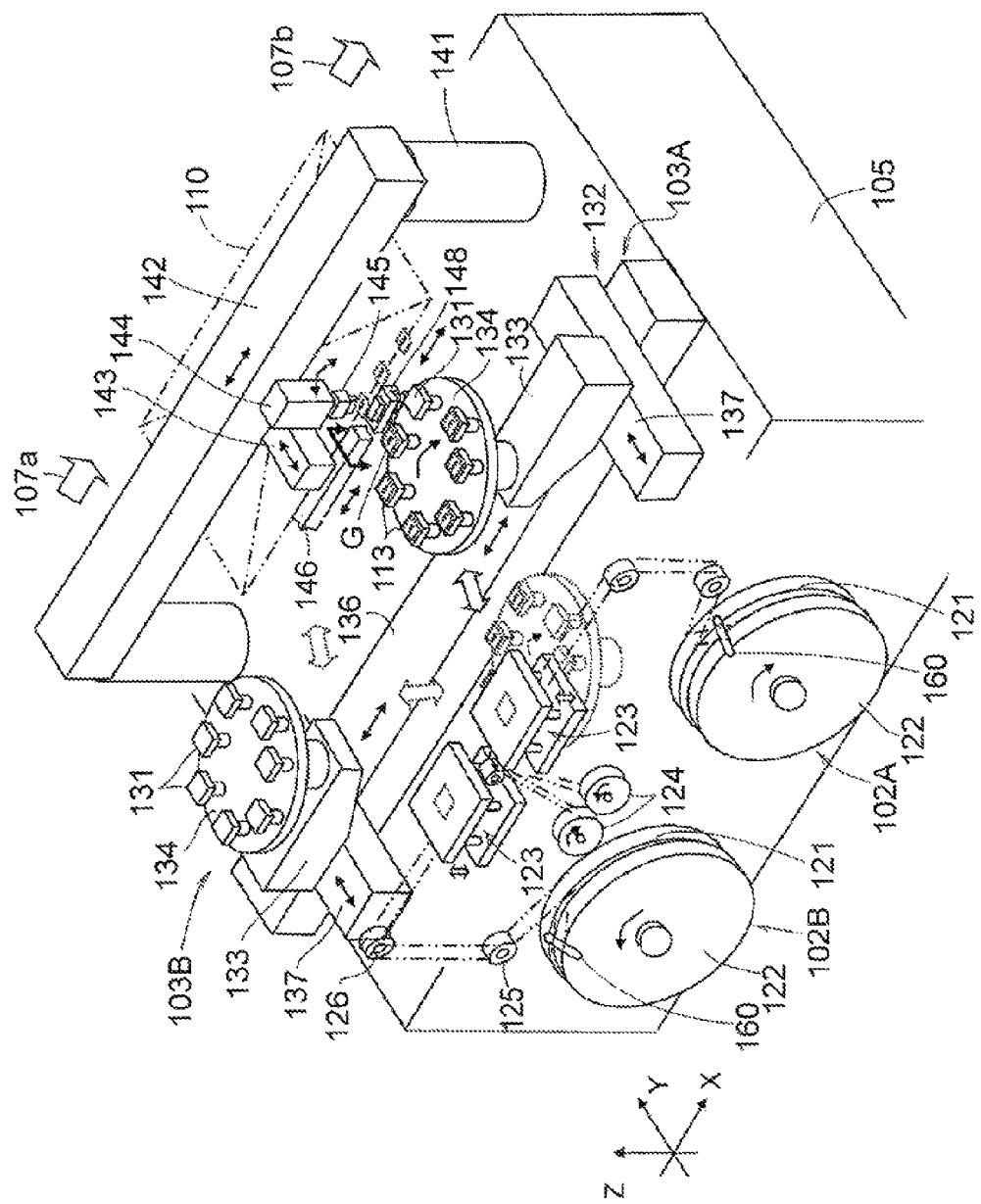
FIG. 20 is a perspective view showing a general schematic configuration of a component placing device in accordance with a fifth embodiment of the invention.
Figure 21:
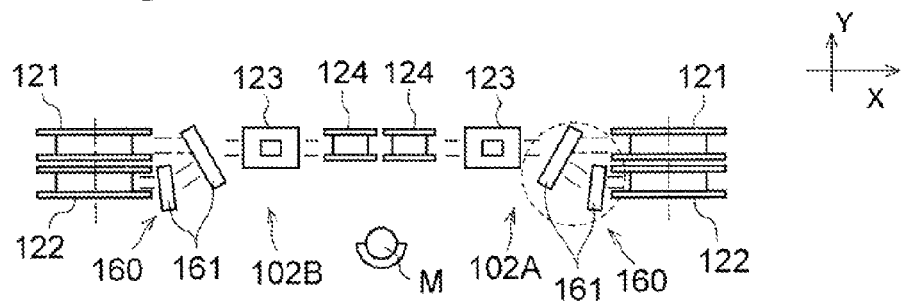
FIG. 21 is a plan view showing component feeding means in accordance with the fifth embodiment.
Figure 22:
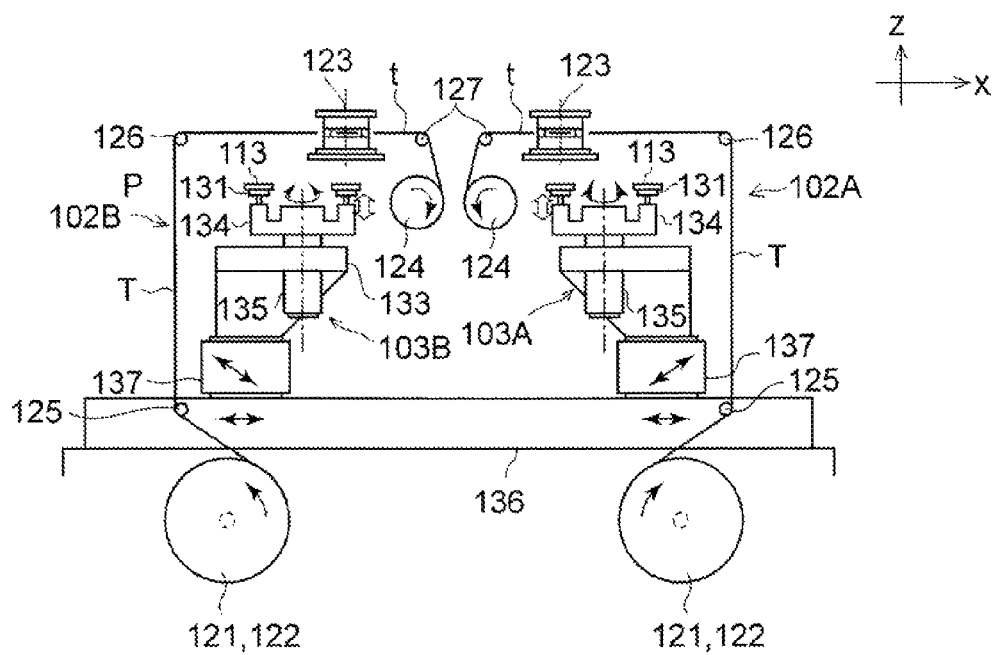
FIG. 22 is a front view showing the component feeding means and component carrying means in accordance with the fifth embodiment.
Figure 23:
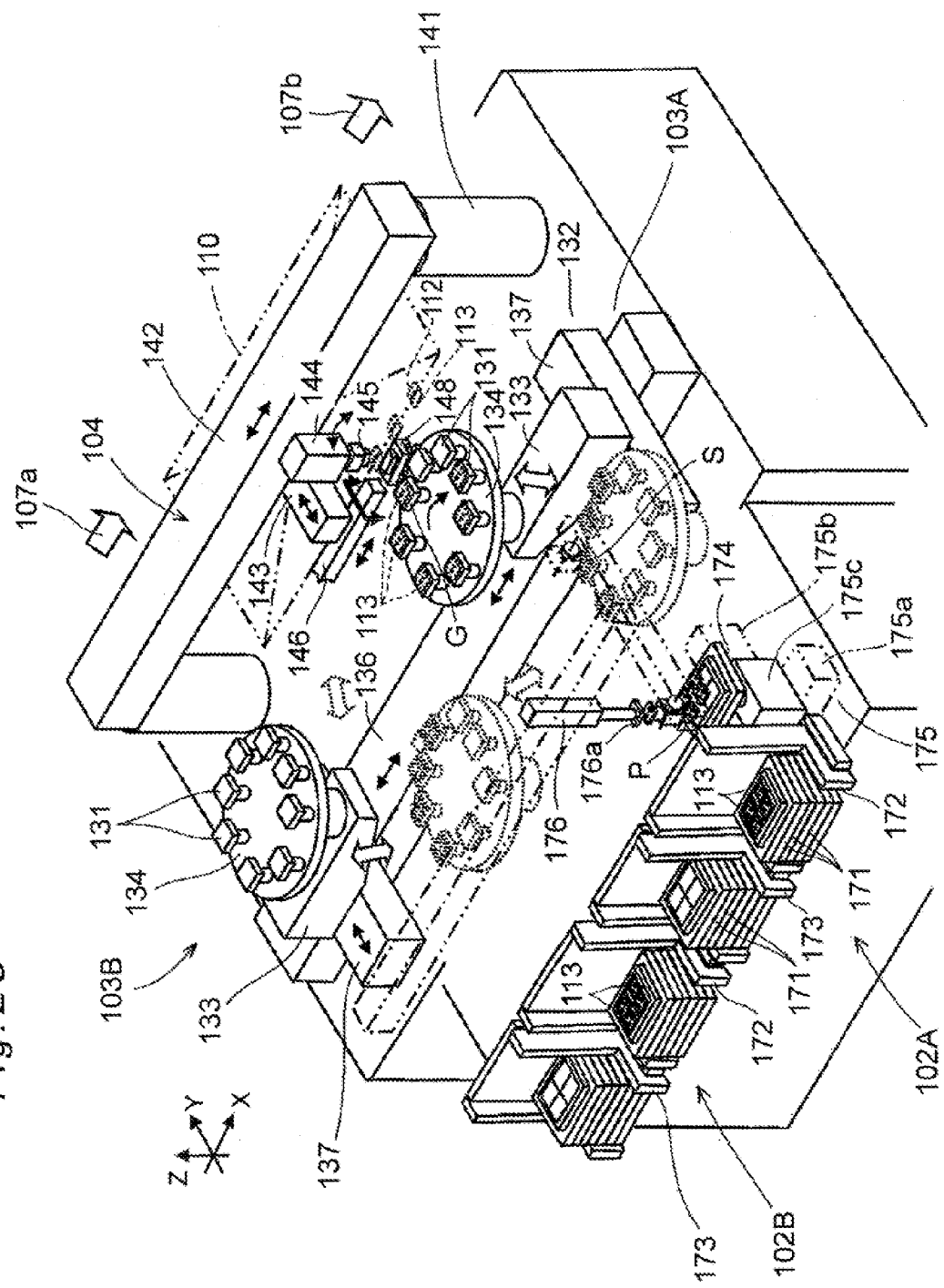
FIG. 23 is a perspective view showing a general schematic configuration of a component placing device in accordance with a sixth embodiment of the invention.
Figure 24:
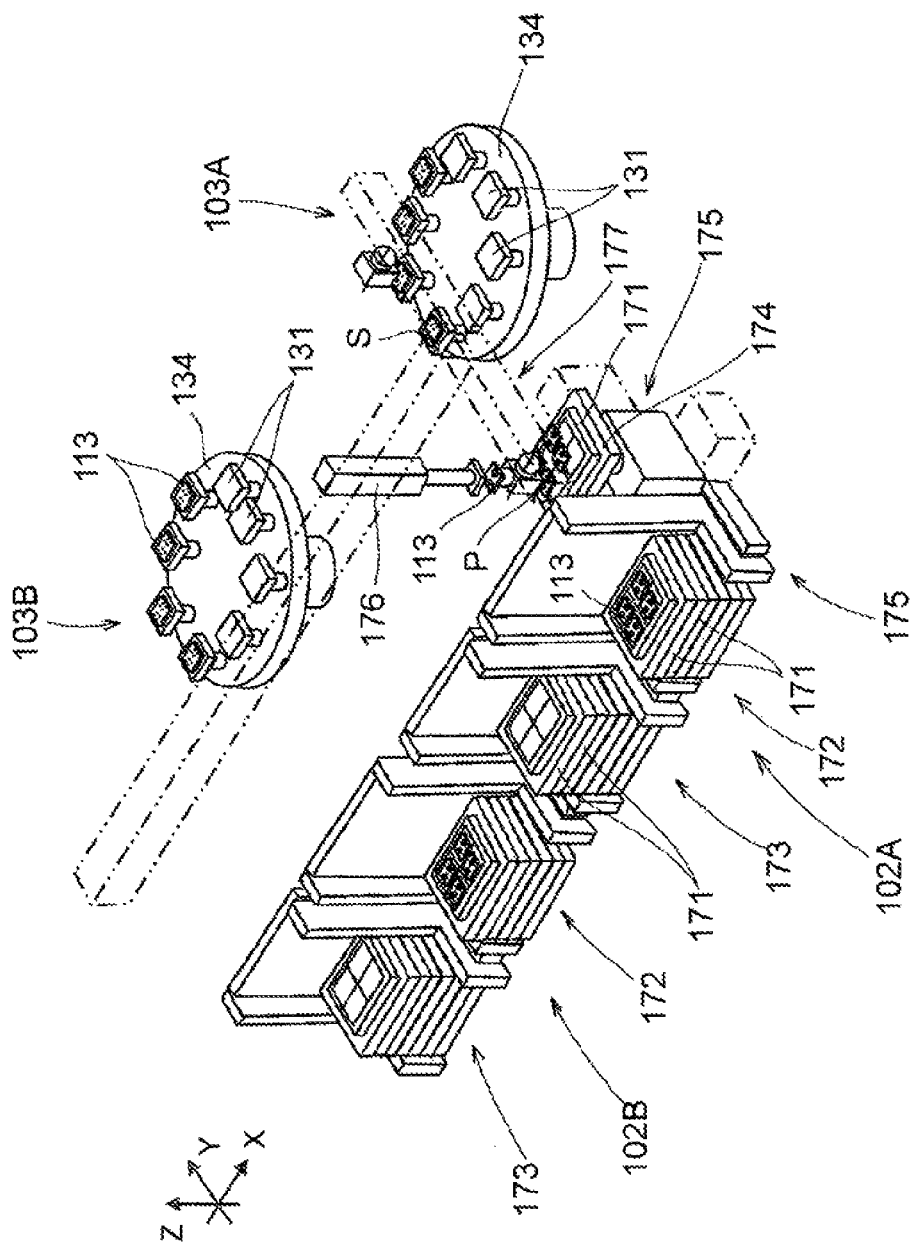
FIG. 24 is a plan view showing component feeding means in accordance with the sixth embodiment.
Figure 32:
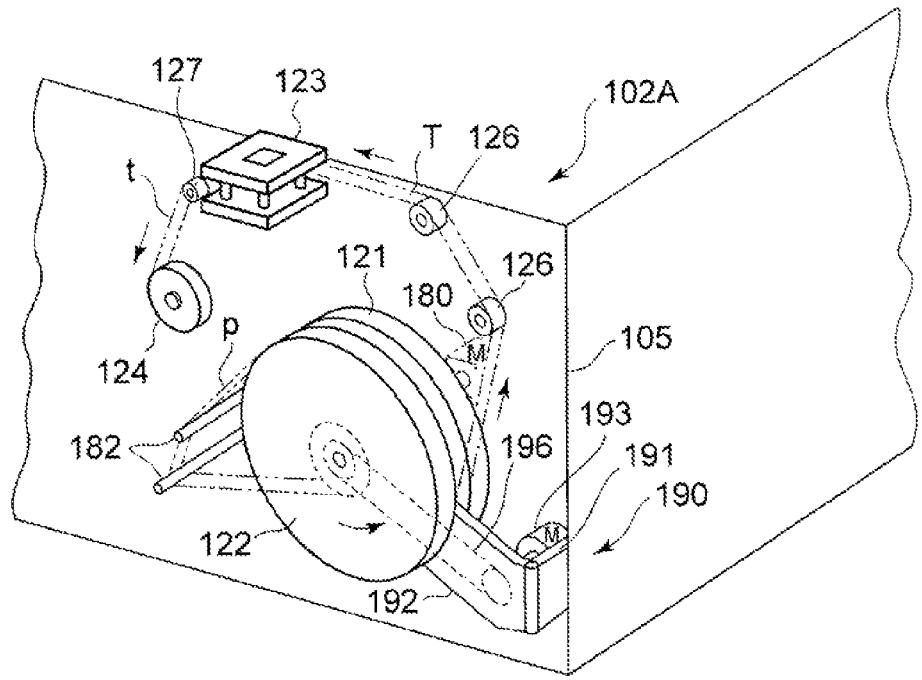
FIG. 32 is a schematic perspective view showing an arrangement configuration (closed state) of reels in accordance with a modification of the fifth embodiment.
Figure 34:
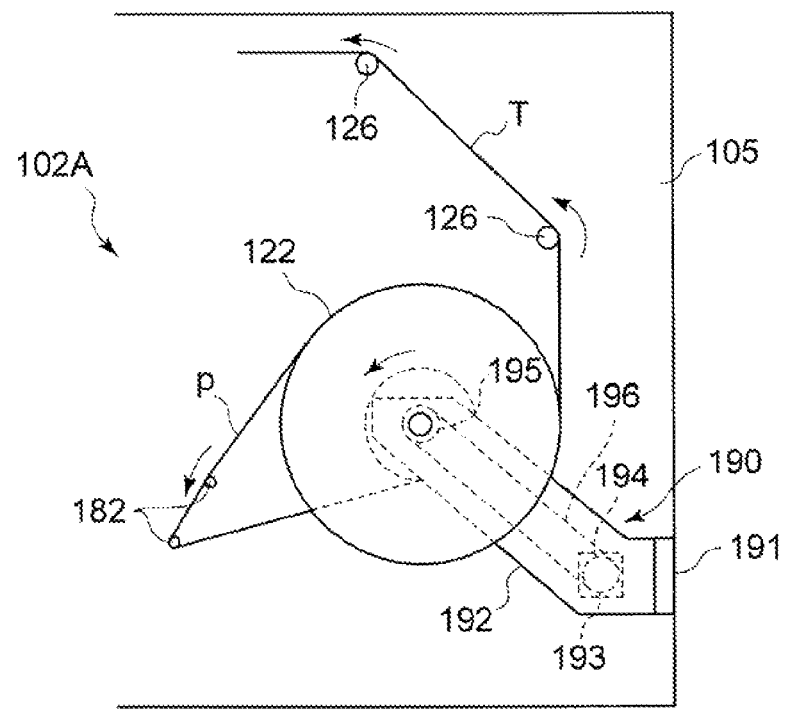
FIG. 34 is a schematic diagram (front view) showing an arrangement configuration of the reels in accordance with the modification of the fifth embodiment.
Figure 35:
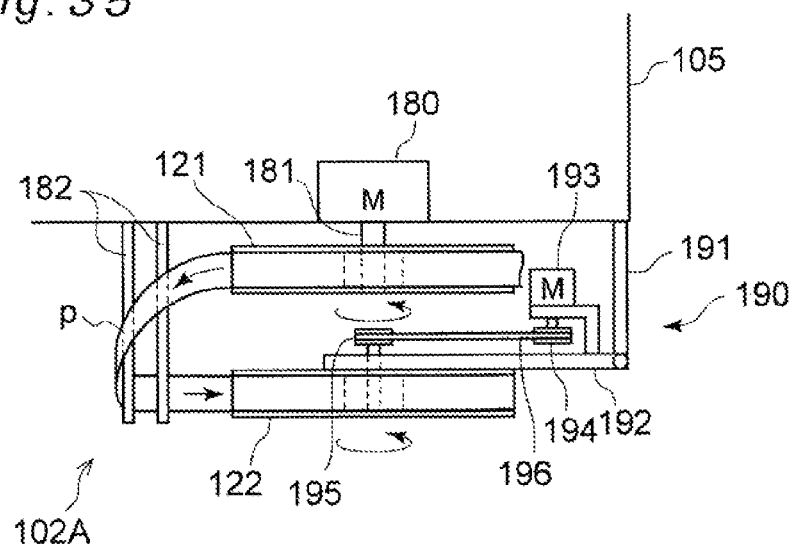
FIG. 35 is a schematic diagram (plan view) showing the arrangement configuration of the reels in accordance with the modification of the fifth embodiment.

As shown in FIGS. 32, 34 and 35, the component mounting apparatus of the modification of the fifth embodiment has a configuration similar to that of the fifth embodiment shown in FIGS. 20 through 22 in that the configuration is employed in which the feeding reels 121 and the protection tape collecting reels 122 are placed so as to coaxially overlap on the front face part of the pedestal 105 on front side in the Y-direction (side of the operator M) in the first and second component feeding units 102A, 102B (only the unit 102A is shown). In the modification, however, a configuration is employed that is different from the fifth embodiment in that the protection tape collecting reels 122 out of the feeding reels 121 and the protection tape collecting reels 122 that are arranged so as to overlap in the Y-direction can be opened and closed on the front side of the pedestal 105 in the Y-direction. Configurations thereof different from those of the fifth embodiment will chiefly be described below.

The feeding reels 121 are rotatably mounted on the front face part in the Y-direction of the pedestal 105. As shown in FIG. 35, specifically, a rotation driving motor 180 for driving and rotating the feeding reel 121 is fixed onto the front face part of the pedestal 105, and the feeding reel 121 is supported by the front face part of the pedestal 105 through a drive shaft 181 connected to the rotation driving motor 180.

On the other hand, the protection tape collecting reel 122 is supported by an opening/closing arm 190 (support member) that is mounted on the front face part of the pedestal 105 so as not to interfere with the feeding reel 121. Specifically, the opening/closing arm 190 comprises a fixed member 191 fixed to the front face part of the pedestal 105 and a pivot member 192 pivotably supported on extremity part of the fixed member 191. The protection tape collecting reel 122 is rotatably supported on extremity part of the pivot member 192. A rotation driving motor 193 for driving and rotating the protection tape collecting reel 122 is supported by the pivot member 192, and the rotation driving motor 193 and the protection tape collecting reel 122 are connected by two pulleys 194, 195 and a belt 196 so that a rotational driving force can be transmitted therethrough.

In the configuration, a protection tape p peeled off from a tape-like component assembly T drawn out of the feeding reel 121 can be shifted in a direction of tape width (i.e., Y-direction) by a plurality of rollers 182 and can be wound on the protection tape collecting reel 122. The plurality of rollers 182 form a tape running path shifting part for shifting a running path of the protection tape p in the direction of tape width.

Figure 33:
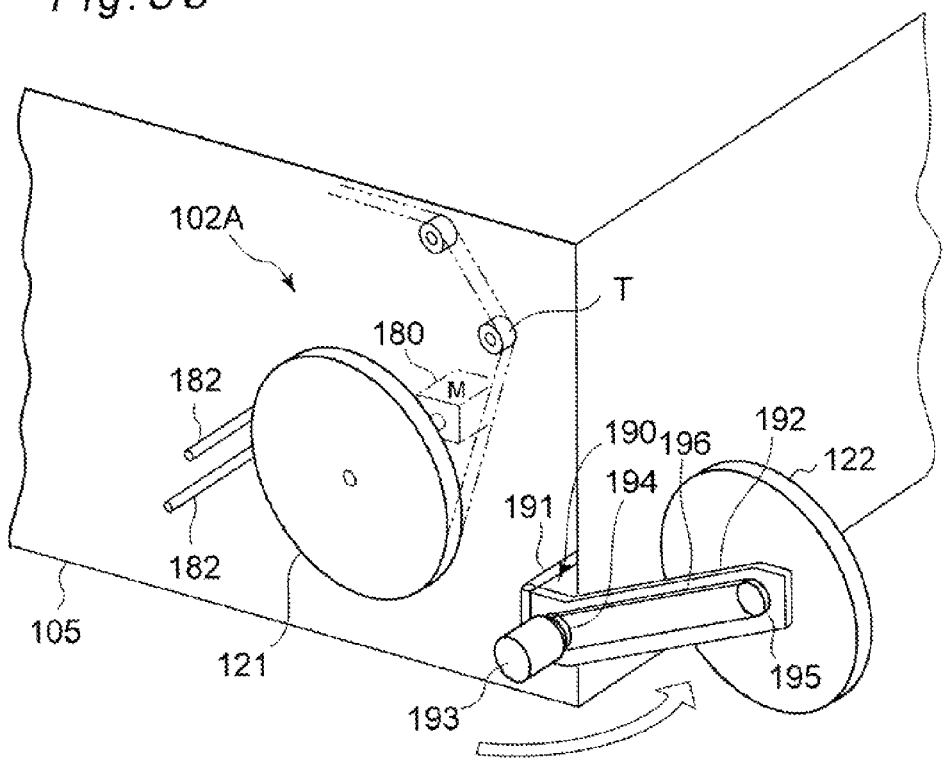
FIG. 33 is a schematic perspective view showing an arrangement configuration (opened state) of the reels in accordance with the modification of the fifth embodiment.

When the pivot member 192 of the opening/closing arm 190 is opened in a state shown in FIG. 32, the pivot member 192 pivots nearly 180 degrees, for instance, so that the overlap between the two reels 121, 122 can be released as shown in FIG. 33. That is, the pivot member 192 of the opening/closing arm 190 is capable of pivoting between a position in which the protection tape collecting reel 122 overlaps with the feeding reel 121 (see FIG. 32) and an overlap released position in which the overlap between the protection tape collecting reel 122 and the feeding reel 121 is released (see FIG. 33) and selectively releasing the overlap between the two reels 121, 122. The rotation driving motor 193, the two pulleys 194, 195 and the belt 196 are supported by the pivot member 192 itself, and those members can be moved together with the protection tape collecting reel 122 from front face side of the feeding reel 121 by pivoting of the pivot member 192.

In the configuration of the modification of the fifth embodiment, the configuration is employed in which the feeding reels 121 and the protection tape collecting reels 122 are placed so as to overlap in the Y-direction on the front face part of the pedestal 105, and thus maintenance property of the feeding reels 121 and the protection tape collecting reels 122 can be made satisfactory while a size of the apparatus in front view in the Y-direction is made compact.

A driving device for the protection tape collecting reel 122 comprising the rotation driving motor 193, the two pulleys 194, 195 and the belt 196 is supported by the pivot member 192 of the opening/closing arm 190, so that maintenance property of the driving device is made satisfactory by the operation of opening the opening/closing arm 190. A configuration, however, may be employed in which the driving device for the protection tape collecting reel 122 is fixed to the front face part of the pedestal 105.

Though the configuration in which the feeding reels 121 and the protection tape collecting reels 122 are coaxially placed on the front face part of the pedestal 105 has been described as an example, the modification is not limited to such a configuration. Effects of the modification can be obtained as long as a configuration is provided in which the feeding reels 121 and the protection tape collecting reels 122 are placed on the front face part of the pedestal 105 so as to have portions overlapping at least in the Y-direction.

The configuration in which the feeding reels 121 and the protection tape collecting reels 122 are placed on the front face part of the pedestal 105 so as to have portions overlapping at least in the V-direction is not applied only to configurations of the apparatus in which the placing head is horizontally moved with the substrate fixed when the operations of placing the components onto the mounting regions are performed as in the first through fourth embodiments. That is, the configuration of the component feeding unit in which the feeding reels 121 and the protection tape collecting reels 122 are placed on the front face part of the pedestal 105 so as to have portions overlapping at least in the Y-direction can be applied to a configuration of the apparatus in which positioning between the placing head and mounting regions is performed by horizontal movement of a substrate when operations of placing components onto the mounting regions are performed as in conventional component mounting (placing) apparatuses.

Sixth Embodiment

Hereinbelow, a sixth embodiment in accordance with the component mounting apparatus of the invention will be described with reference to FIGS. 23 through 27A, 27B. The configuration in which the components 113 are picked up and fed from the tape-like component assemblies T has been described as one example of the component feeding units 102A, 102B for the third through fifth embodiments, whereas components 113 are fed from trays 171 each having a plurality of components 113 housed side by side therein in the sixth embodiment.

Figure 25A:
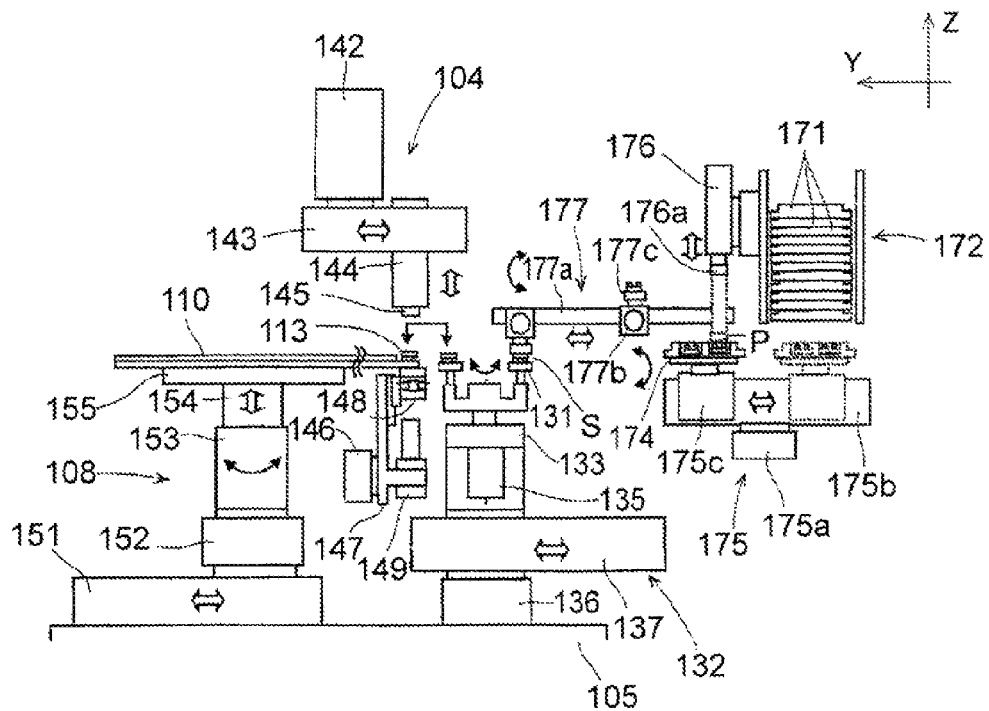
FIG. 25A is a side view for illustrating an operation step in the sixth embodiment.
Figure 25B:
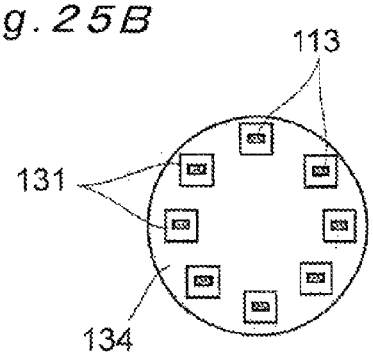
FIG. 25B is a plan view of a rotating plate in accordance with the sixth embodiment.

In component feeding units 102A, 102B in the sixth embodiment, as shown in FIGS. 23 through 25A, 25B, feeding side tray housing units 172 for housing a plurality of stacked trays 171 containing the components 113 and collecting side tray housing units 173 for housing a plurality of empty trays 171 having fed the components 113 are arranged in a line in an X-direction along a substrate conveyance direction. The feeding side tray housing units 172 are each configured so that the stacked trays 171 can sequentially be taken out from lower side and can be fed to a tray feeding position just below the unit as shown in FIG. 25A, and the collecting side tray housing units 173 are each configured so that a tray 171 in a tray collecting position just below the unit can be collected inversely and can be housed in a state stacked from the lower side. The lowermost tray 171 in the feeding side tray housing unit 172 is fed to the tray feeding position just below the feeding side tray housing unit 172 by up-and-down operations of a shutter mechanism (not shown) provided in the feeding side tray housing unit 172 and of a tray loading part 174 in a state in which the tray 171 is loaded on the tray loading part 174. The empty tray 171 from which the components 113 have been fed is positioned in the tray collecting position just below the collecting side tray housing unit 173 in the state in which the tray 171 is loaded on the tray loading part 174, and is collected to the lowermost level in the collecting side tray housing unit 173 by up-and-down operations of the tray loading part 174 and by a shutter mechanism (not shown) provided in the collecting side tray housing unit 173.

The tray loading part 174 is configured so as to be movable and positionable in three-dimensional directions by loading part moving means 175 comprising an X-axis table 175a for the X-direction along a direction in which the tray housing units 172, 173 are arranged, a Y-axis table 175b for a Y-direction orthogonal the X-direction, and a Z-axis table 175c perpendicular to a horizontal plane, so that the components 113 housed in the tray 171 can sequentially be positioned in a specified component pickup position P. Just over the component pickup position P is provided component pickup means 176 for picking up the component 113 from the tray 171 by sucking the component 113 by a suction head 176a and by rising.

There is also provided component inverting carrying means 177 for receiving the component 113 facing upward from the component pickup means 176, inverting the component upside down so that the component faces downward, and carrying the component 113 to the component holding member 131 of the component carrying unit 103A, 103B in the component feeding position S. The component inverting carrying means 177 is capable of moving in the Y-direction orthogonal to the substrate conveyance direction between a position under a rising limit position of the suction head 176a of the component pickup means 176 and a position over the component feeding position S where the component 113 is fed to the component carrying units 103A, 103B. The component inverting carrying means 177 further includes a suction head 177c for sucking the component 113 so as to be capable of inverting the component 180 degrees upside down on a movable member 177b that can be moved in the Y-direction by a Y-axis table 177a.

Operations of feeding the components 113 to the component feeding position S by the component feeding units 102A, 102B in the sixth embodiment will be described. The lowermost tray 171 in the feeding side tray housing unit 172 of the component feeding units 102A, 102B is received on the tray loading part 174 positioned in the tray feeding position. In that state, operations are repeated of moving the tray loading part 174 by the loading part moving means 175 so that each component 113 housed in the tray 171 can sequentially be positioned in the component pickup position P, picking up the component 113 by the component pickup means 176, inverting the component 113 upside down and feeding the component to the component feeding position S by the component inverting carrying means 177, and causing the component holding member 131 of the component carrying units 103A, 103B to sequentially hold the component. With the repetition of the operations, the components 113 housed in the tray 171 are held by the plurality of component holding members 131 in series. Once the tray 171 on the tray loading part 174 is emptied, the tray loading part 174 is moved to the tray collecting position just below the collecting side tray housing units 173 and the tray is collected onto the lowermost level in the collecting side tray housing units 173. By the repetition of the above operations, the operations of feeding the components 113 housed in the tray 171 to the component feeding position S can be performed automatically and efficiently.

Though the components 113 fed by the component feeding units 102A, 102B may be of the same type, the component feeding unit 102A may feed the components 113 for a source side of the substrate 110 and the component feeding unit 102B may feed the components 113 for a gate side of the substrate 110. Such a configuration makes it possible for the single component mounting apparatus 101 to place the components 113 for both the source side and the gate side of the substrate 110.

Figure 26:
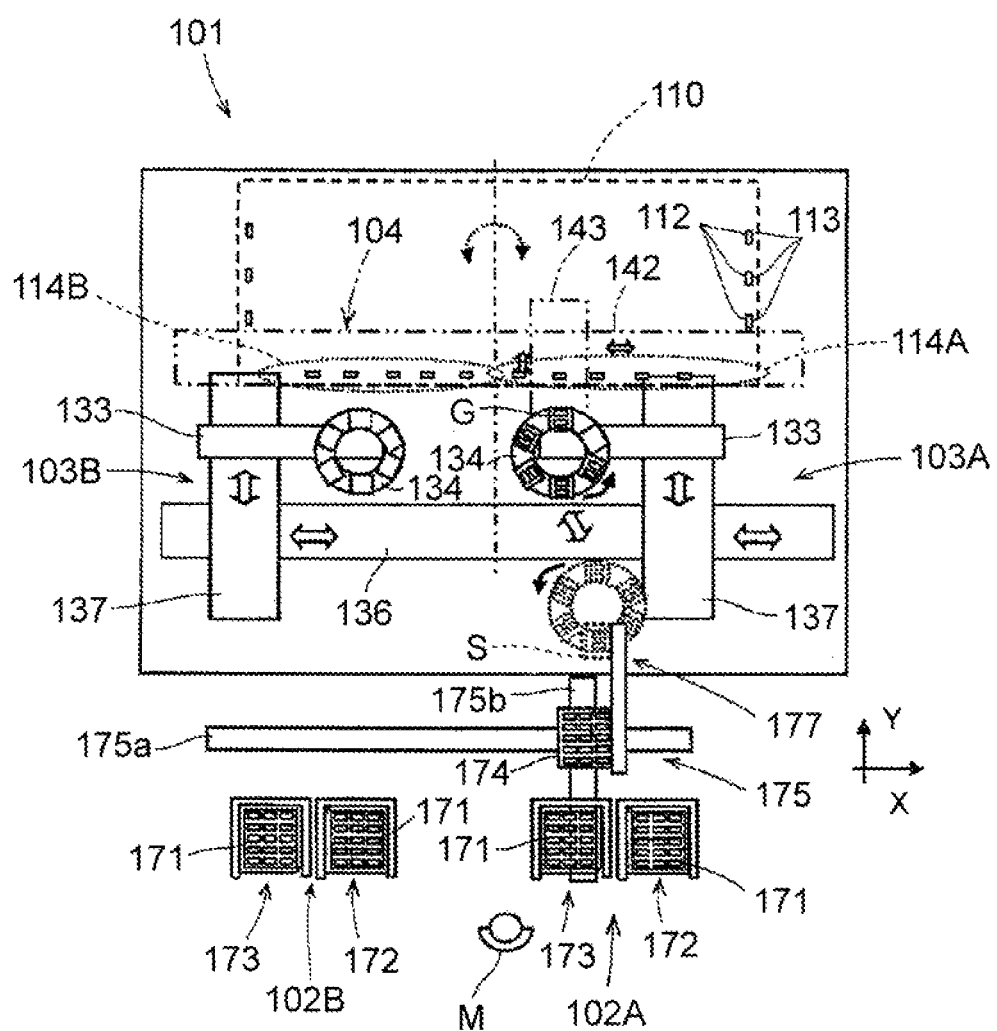
FIG. 26 is a plan view showing a general schematic configuration of a component placing device in accordance with a seventh embodiment of the invention.
Figures 27A, 27B:
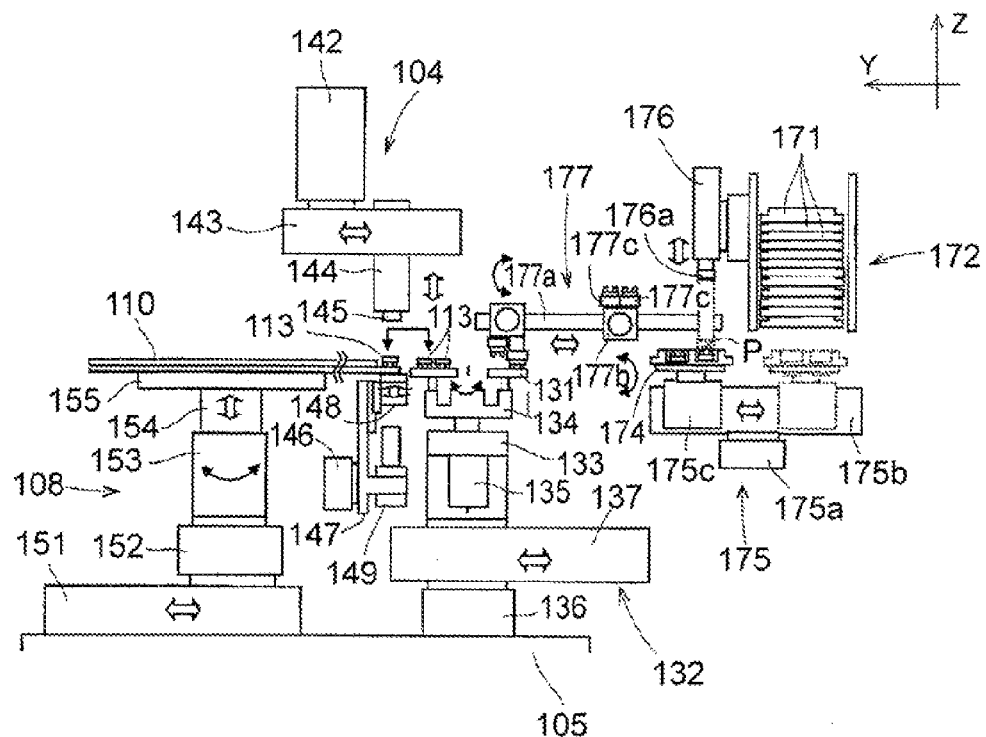
FIG. 27A is a side view for illustrating an operation step in the seventh embodiment.
FIG. 27B is a plan view of a rotating plate in accordance with the seventh embodiment.

For an example shown in FIGS. 23 through 25A, 25B, a configuration in which the component inverting carrying means 177 of the component feeding units 102A, 102B and the component holding members 131 (see FIG. 25B) of the component carrying units 103A, 103B each move while holding one component 113 has been described as the example. In place of such a configuration, the component inverting carrying means 177 may be equipped with a plurality of suction heads 177c, as shown in FIGS. 26, 27A, and 27B, the suction heads 177c sucking and holding the components 113 may be inverted upside down and may be moved to the component feeding position S, and/or a plurality of components 113 may be held by each component holding member 131, as shown in FIG. 27B.

Seventh Embodiment

Figure 28:
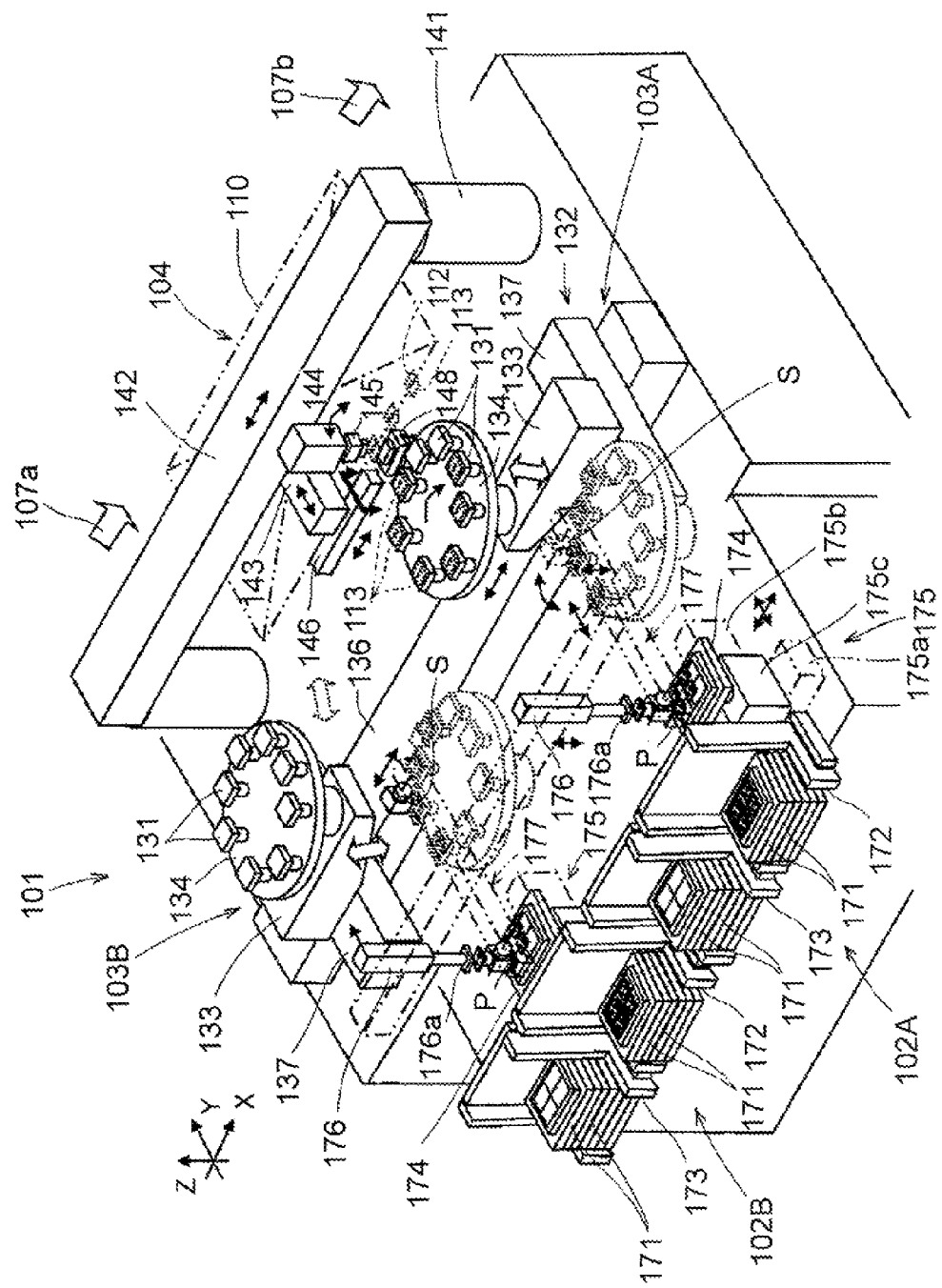
FIG. 28 is a perspective view showing a general schematic configuration of a component placing device in accordance with an eighth embodiment of the invention.
Figure 29:
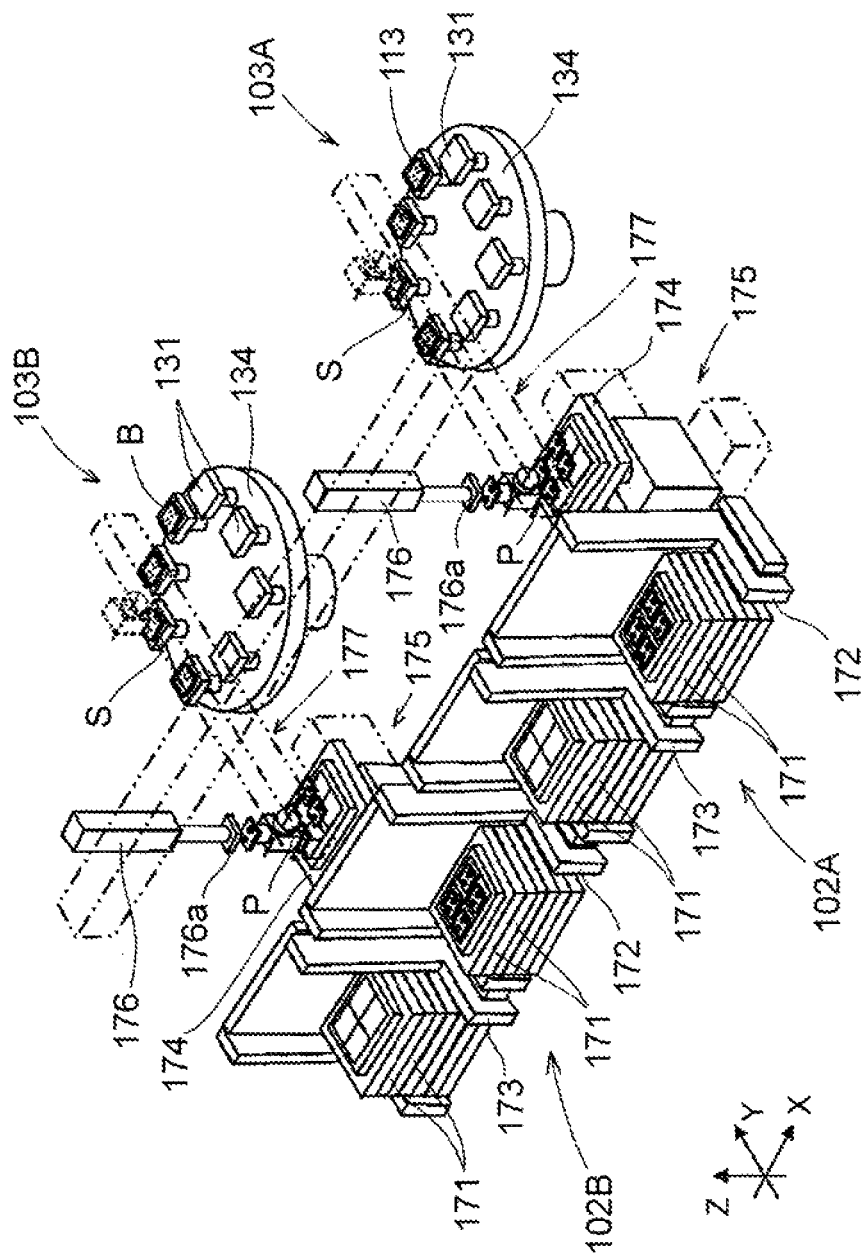
FIG. 29 is a perspective view showing component feeding means in accordance with the eighth embodiment.

Hereinbelow, a seventh embodiment in accordance with the component mounting apparatus of the invention will be described with reference to FIGS. 28, 29. For the sixth embodiment, a configuration in which the one tray loading part 174, the one loading part moving means 175, the one component pickup means 176, and the one component inverting carrying means 177 are provided for the plurality of component feeding units 102A, 102B and in which the components 113 are fed to the first and second component carrying units 103A, 103B in the one component feeding position S has been described as an example. In place of such a configuration, the seventh embodiment is configured so that component feeding units 102A, 102B are each provided with a tray loading part 174, loading part moving means 175, component pickup means 176, and component inverting carrying means 177 and so that components 113 are fed to component feeding positions S that are defined for the component carrying units 103A and 103B, respectively, as in the third embodiment. In such a configuration, efficient component placement can be performed for a large substrate having a large number of mounting regions 112, in particular.

Eighth Embodiment

Figure 30:
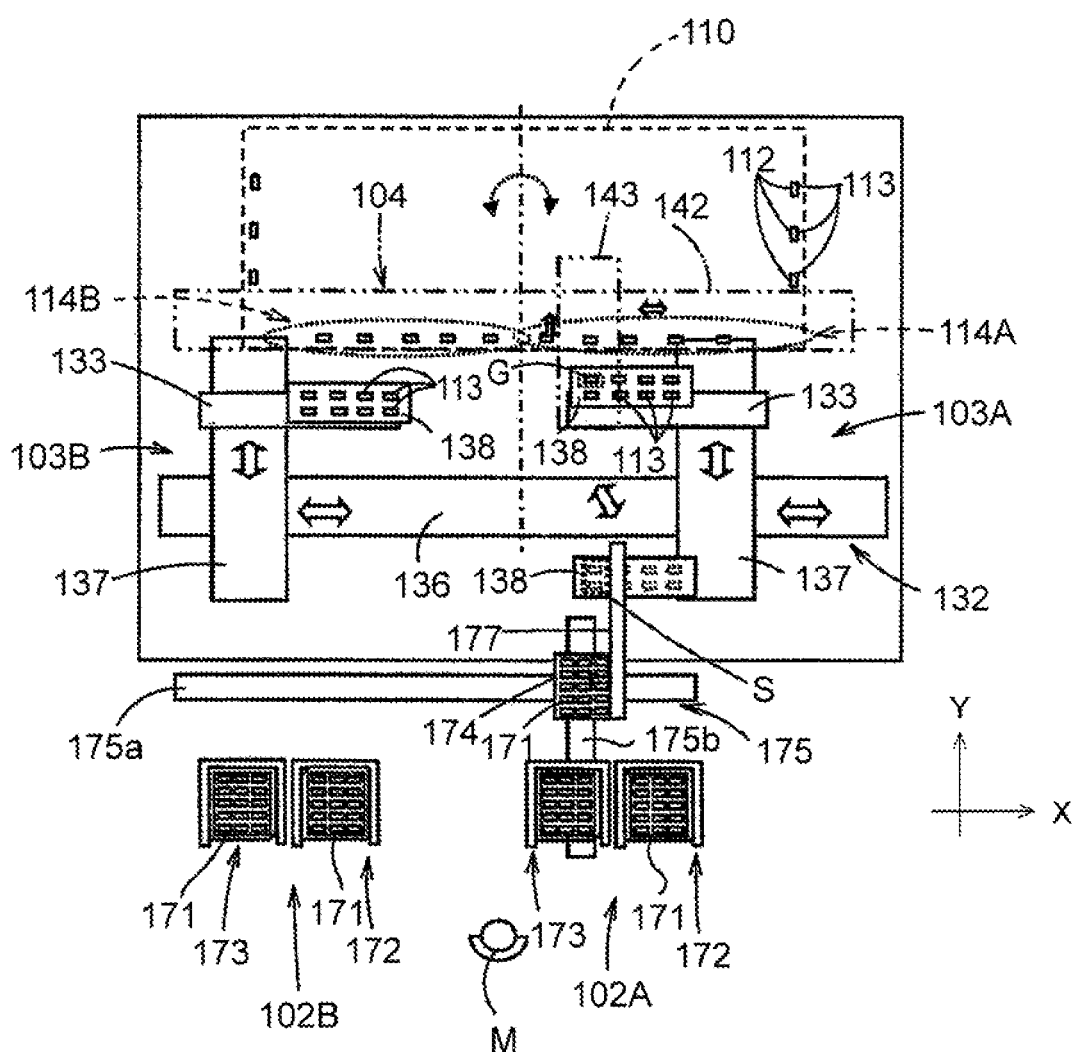
FIG. 30 is a plan view showing a general schematic configuration of a component placing device in accordance with a ninth embodiment of the invention.

Hereinbelow, an eighth embodiment in accordance with the component mounting apparatus of the invention will be described with reference to FIG. 30. For the third through seventh embodiments, the examples of configuration of the first and second component carrying units 103A, 103B have been described in which the rotating plate 134 is provided on the movable member 133 of the two-axis robot 132 and in which the plurality of component holding members 131 are provided on the outer circumferential part of the rotating plate 134. The eighth embodiment is configured so that holder plates 138 each capable of holding a plurality of components 113 arrayed in matrix are provided on movable members 133 of a two-axis robot 132, so that the components 113 fed in a component feeding position S are held in matrix-like arrays on the holder plates 138, and so that the components 113 held on the holder plates 138 are sequentially positioned in component delivery positions G and are delivered to the component placing unit 104 by the two-axis robot 132.

In the configuration of the eighth embodiment, the plurality of components 113 fed from component feeding units 102A, 102B can be held by the holder plates 138 of the first and second component carrying units 103A, 103B, can sequentially be positioned in the component delivery positions G, and can be delivered to the component placing unit 104. Therefore, efficient component placement can be performed. A more compact shape can be attained by the holder plates 138 on which the components 113 can be arrayed in matrix.

It is to be noted that, by properly combining the arbitrary embodiments of the aforementioned various embodiments, the effects possessed by them can be produced.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The disclosure of specification, drawings, and claims of Japanese patent application No. 2009-002320 filed on Jan. 8, 2009, the disclosure of specification, drawings, and claims of Japanese patent application No. 2009-014760 filed on Jan. 26, 2009, and the disclosure of specification, drawings, and claims of Japanese patent application No. 2009-069627 filed on Mar. 23, 2009 are incorporated herein by reference in its entirety.

The invention claimed is:

1. A component mounting method for mounting components on a plurality of mounting regions placed on an edge part of a substrate along a first direction that is a direction along the edge part of the substrate, the component mounting method comprising:

feeding the components to a component feeding position;

holding the components in the component feeding position by component holding members and sequentially carrying the components to respective component delivery positions, wherein the component delivery positions are spaced from the edge part of the substrate in a second direction intersecting with the first direction, and wherein the component delivery positions are arranged along the first direction so as to correspond to the mounting regions respectively in the second direction; and holding the components in the respective component delivery positions by a placing head, moving the held components in the second direction, and sequentially placing the components onto the corresponding mounting regions.

2. The component mounting method as defined in claim 1, wherein in said holding of the components in the component feeding position, the components are sequentially held by the component holding members.

3. The component mounting method as defined in claim 1, wherein in said holding of the components in the component feeding position and said carrying of the components to the respective component delivery positions, the components fed to the component feeding position are sequentially held by the component holding members, the component holding members being arranged with a uniform interval pitch on a circumference of a rotating plate that is movable and intermittently rotatable so as to be positioned in the first and second directions, and the held components are sequentially carried to the placing head with the component holding members being sequentially positioned in the respective component delivery positions by movement in the first and second directions and intermittent rotation of the rotating plate.

4. The component mounting method as defined in claim 1, wherein the plurality of mounting regions arranged on the edge part of the substrate are divided into a first mounting area and a second mounting area, in said carrying of the components to the respective component delivery positions, a carrying operation for carrying components to the respective component delivery positions corresponding to the mounting regions in the first mounting area is performed by a first component carrying unit having a plurality of component holding members, and a carrying operation for carrying components to the respective component delivery positions corresponding to the mounting regions in the second mounting area is performed by a second component carrying unit having a plurality of component holding members, in said holding of the components in the component feeding position, said carrying of the components to the respective component delivery positions and said placing of the components onto the corresponding mounting regions, the components fed to the component feeding position are sequentially held by the component holding members of the second component carrying unit, while the carrying operation is performed by the first component carrying unit and the components delivered from the first component carrying unit to the placing head in the respective component delivery positions are sequentially placed onto the corresponding mounting regions in the first mounting area, and the carrying operation by the second component carrying unit is performed upon completion of the placement of the components onto the corresponding mounting regions in the first mounting area so that the components delivered to the placing head in the respective component delivery positions by the second component carrying unit are sequentially placed onto the corresponding mounting regions in the second mounting area.

5. The component mounting method as defined in claim 4, wherein in said placing of the components onto the corresponding mounting regions, a placing operation for sequentially placing the components, delivered from the first component carrying unit, onto the corresponding mounting regions in the first mounting area is performed by a first placing head, and a placing operation for sequentially placing the components, delivered from the second component carrying unit, onto the corresponding mounting regions in the second mounting area is performed by a second placing head.

6. A component mounting apparatus for mounting components on a plurality of mounting regions placed on an edge part of a substrate along a first direction that is a direction along the edge part of the substrate, the component mounting apparatus comprising:

a component feeding unit for sequentially feeding the components to a component feeding position;

a component carrying unit for holding one of the components fed to the component feeding position, for moving the held component, and for placing the component in a respective component delivery position of a plurality of component delivery positions, wherein the plurality of component delivery positions are spaced from the plurality of mounting regions in a second direction intersecting with the first direction, and wherein the plurality of component delivery positions are arranged along the first direction so as to correspond to the mounting regions respectively in the second direction; and a component placing unit for holding the component placed in the respective component delivery position, for moving the held component in the second direction, and for placing the component onto a corresponding one of the mounting regions, wherein the component feeding position is a position spaced from the component delivery positions in the first direction, and wherein the component carrying unit comprises:

a component holding member for holding the one of the components fed to the component feeding position; and a holding member moving device for moving the component holding member at least in the first direction between the component feeding position and the component delivery positions.

7. The component mounting apparatus as defined in claim 6, wherein the component placing unit comprises:

a placing head for holding the component placed in the respective component delivery position and for placing the held component onto the corresponding one of the mounting regions;

a second-direction moving device for moving the placing head in the second direction between the component delivery positions and the mounting regions; and a first-direction moving device for moving the placing head in the first direction.

8. The component mounting apparatus as defined in claim 7, further comprising a control device for controlling moving operations performed by the first-direction moving device, the second-direction moving device, and the holding member moving device so that the component holding member is moved in the second direction by the holding member moving device at a moving velocity which is higher than a moving velocity of the placing head moved by the first-direction moving device and the second-direction moving device.

9. The component mounting apparatus as defined in claim 8, wherein the control device controls operations of the component placing unit and the component carrying unit so that the component holding member is moved from a first component delivery position in the first direction and holds a new component in the component feeding position, and the component holding member holding the new component is moved in the first direction and places the new component in a second component delivery position, during a period beginning from a point at which the placing head holds a component in the first component delivery position until the placing head is moved in the second direction and places the component in a corresponding mounting position and then the placing head is moved in the first and second directions to the second component delivery position.

10. A component mounting apparatus for mounting components on a plurality of mounting regions placed on an edge part of a substrate along a first direction that is a direction along the edge part of the substrate, the component mounting apparatus comprising:
    a component feeding unit for sequentially feeding the components to a component feeding position;
    a component carrying unit for holding one of the components fed to the component feeding position, for moving the held component, and for placing the component in a respective component delivery position of a plurality of component delivery positions, wherein the plurality of component delivery positions are spaced from the plurality of mounting regions in a second direction intersecting with the first direction, and wherein the plurality of component delivery positions are arranged along the first direction so as to correspond to the mounting regions respectively in the second direction; and
    a component placing unit for holding the component placed in the respective component delivery position, for moving the held component in the second direction, and for placing the component onto a corresponding one of the mounting regions,
    wherein the component carrying unit comprises:
        a plurality of component holding members for holding respective ones of the components sequentially fed to the component feeding position; and
        a holding member moving device for horizontally moving the plurality of component holding members from the component feeding position so as to sequentially place the component holding members in respective component delivery positions.

11. The component mounting apparatus as defined in claim 10, wherein the component placing unit comprises:
    a placing head for holding one of the components placed in the respective component delivery positions and for placing the held component onto a corresponding one of the mounting regions;
    a second-direction moving device for moving the placing head in the second direction between the component delivery positions and the mounting regions; and
    a first-direction moving device for moving the placing head in the first direction.

12. The component mounting apparatus as defined in claim 11, wherein the component carrying unit further comprises a rotating plate which has the plurality of component holding members arranged with a uniform interval pitch on a circumference thereof, and which intermittently rotates the plurality of component holding members with the uniform interval pitch,
    and wherein the holding member moving device has a movable member on which the rotating plate is mounted and a two-axis robot for moving the movable member in the first and second directions.

13. The component mounting apparatus as defined in claim 12, wherein the component carrying unit comprises a first component carrying unit, the component mounting apparatus further comprising:
    a second component carrying unit which includes
        a plurality of component holding members for holding respective ones of the components sequentially fed to the component feeding position,
        a holding member moving device for horizontally moving the plurality of component holding members from the component feeding position so as to sequentially place the component holding members in respective component delivery positions, and
        a rotating plate which has the plurality of component holding members arranged with a uniform interval pitch on a circumference thereof, and which intermittently rotates the plurality of component holding members with the uniform interval pitch, wherein the holding member moving device of the second component carrying unit has a movable member on which the rotating plate is mounted and a two-axis robot for moving the movable member in the first and second directions,
    wherein the first and second component carrying units are placed so as to adjoin in the first direction, and wherein the movable members of the first and second component carrying units have shapes protruding toward each other with the rotating plates mounted on extremity parts of the protruding shapes, respectively; and
    a control device for controlling operations of the first and second component carrying units so that the plurality of component holding members of the second component carrying unit are sequentially positioned in the component feeding position and perform operations of picking up respective components from the component feeding position while the plurality of component holding members of the first component carrying unit are sequentially positioned in the respective component delivery positions and perform operations of delivering components to the component placing head.

14. The component mounting apparatus as defined in claim 10, wherein the plurality of mounting regions provided on the edge part of the substrate are divided into a first mounting area and a second mounting area,
    wherein the component carrying unit comprises a first component carrying unit for placing components in respective component delivery positions which correspond to the mounting regions in the first mounting area,
    wherein the component feeding unit comprises a first component feeding unit,
    wherein the component mounting apparatus further comprises:
        a second component carrying unit for placing components in respective component delivery positions which correspond to the mounting regions in the second mounting area, wherein the second component carrying unit includes a plurality of component holding members for holding respective ones of the components sequentially fed to the component feeding position, and a holding member moving device for horizontally moving the plurality of component holding members from the component feeding position so as to sequentially place the component holding members in the respective component delivery positions;

a second component feeding unit for sequentially feeding components to the component feeding position; and a control device for controlling operations of the first and second component carrying units, the first and second component feeding units, and the component placing unit so that the components fed from the first or second component feeding unit are sequentially held by the second component carrying unit in the component feeding position while the plurality of components held by the first component carrying unit are delivered to the component placing unit in the respective component delivery positions and are sequentially placed onto the corresponding mounting regions in the first mounting area by the component placing unit, and so that the plurality of components held by the second component carrying unit are delivered to the component placing unit in the respective component delivery positions and are sequentially placed onto the corresponding mounting regions in the second mounting area by the component placing unit after the placement of the components onto the mounting regions in the first mounting area is completed.

15. The component mounting apparatus as defined in claim 14, wherein the component placing unit comprises a first component placing unit for sequentially placing the components delivered from the first component carrying unit onto the corresponding mounting regions in the first mounting area, and wherein the component mounting apparatus further comprises a second component placing unit for sequentially placing the components delivered from the second component carrying unit onto the corresponding mounting regions in the second mounting area.

16. The component mounting apparatus as defined in claim 10, wherein the component feeding unit comprises:

a feeding reel on which a tape-like component assembly is wound, wherein the tape-like component assembly includes a plurality of components housed in series on a carrier tape;

a takeup reel on which the carrier tape with the components picked up from the tape-like component assembly is wound; and a component pickup unit that is placed between the feeding reel and the takeup reel and that sequentially picks up the components from the tape-like component assembly, wherein the feeding reel and the takeup reel are placed in postures along the first direction, and the component pickup unit sequentially feeds the plurality of components which are picked up from the tape-like component assembly to the component feeding position.

17. The component mounting apparatus as defined in claim 10, wherein the component feeding unit comprises:

a feeding side tray housing unit for housing a plurality of trays in a stacked state, each tray containing a plurality of components, for sequentially taking out the trays from a lower side of the stacked trays, and for feeding the trays to a tray feeding position;

a collecting side tray housing unit for housing the trays placed at a tray collecting position after feeding of the components, in a stacked state from a lower side of the stacked trays;

a loading part moving device for moving a tray loading part to be loaded with a tray between the tray feeding position, a component feeding tray position for feeding of the components to the component carrying unit, and the tray collecting position;

a component pickup unit for sequentially picking up the components from the tray in the component feeding tray position; and a component inverting carrying unit for receiving a component from the component pickup unit, inverting the component, moving to the component feeding position, and carrying the component to a component holding member of the component carrying unit.

* * * * *